(12) United States Patent
Hasebe et al.

(10) Patent No.: US 8,062,911 B2
(45) Date of Patent: Nov. 22, 2011

(54) METHOD OF MANUFACTURING A SEMICONDUCTOR INTEGRATED CIRCUIT DEVICE AND A METHOD OF MANUFACTURING A THIN FILM PROBE SHEET FOR USING THE SAME

(75) Inventors: Akio Hasebe, Tokyo (JP); Yasuhiro Motoyama, Tokyo (JP); Yasunori Narizuka, Tokyo (JP); Seigo Nakamura, Tokyo (JP); Kenji Kawakami, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 433 days.

(21) Appl. No.: 11/958,369

(22) Filed: Dec. 17, 2007

(65) Prior Publication Data

US 2008/0160657 A1 Jul. 3, 2008

(30) Foreign Application Priority Data

Dec. 28, 2006 (JP) ................................. 2006-355578

(51) Int. Cl.
*H01L 21/66* (2006.01)
*G01R 31/26* (2006.01)
(52) U.S. Cl. ................ 438/17; 438/14; 438/18; 257/48; 257/E21.529; 257/E21.531

(58) Field of Classification Search .................... 438/14, 438/17–18; 257/E21.531, 48, E21.529; 324/754
See application file for complete search history.

(56) References Cited

U.S. PATENT DOCUMENTS

2002/0129323 A1* 9/2002 Kasukabe et al. ................ 716/4
2006/0094162 A1 5/2006 Yabushita et al.
2006/0192575 A1* 8/2006 Kasukabe et al. ............ 324/754

FOREIGN PATENT DOCUMENTS

JP 2006-118945 A 5/2006

* cited by examiner

*Primary Examiner* — Thanh V Pham
*Assistant Examiner* — Maria Ligai
(74) *Attorney, Agent, or Firm* — Miles & Stockbridge P.C.

(57) ABSTRACT

A probe having a sufficient height is manufactured by selectively depositing, over the main surface of a wafer, a copper film in a region in which a metal film is to be formed and a region which will be outside an adhesion ring when a probe card is fabricated; forming the metal film, polyimide film, interconnect, another polyimide film, another interconnect and a further polyimide film; and then removing the wafer and copper film. According to the present invention, when probe testing is performed using a prober (thin film probe) having the probe formed in the above-described manner while utilizing the manufacturing technology of semiconductor integrated circuit devices, it is possible to prevent breakage of the prober and a wafer to be tested.

9 Claims, 29 Drawing Sheets

METHOD OF MANUFACTURING A SEMICONDUCTOR INTEGRATED CIRCUIT DEVICE AND A METHOD OF MANUFACTURING A THIN FILM PROBE SHEET FOR USING THE SAME

CROSS-REFERENCE TO RELATED APPLICATIONS

The disclosure of Japanese Patent Application No. 2006-355578 filed on Dec. 28, 2006 including the specification, drawings and abstract is incorporated herein by reference in its entirety.

BACKGROUND OF THE INVENTION

The present invention relates to a manufacturing technology of a semiconductor integrated circuit device, particularly to a technology effective when applied to electrical testing of a semiconductor integrated circuit that is carried out by pressing a probe of a probe card against an electrode pad of the semiconductor integrated circuit device.

Japanese Patent Application Laid-open No. 2006-118945 has disclosed a technology, in a prober equipped with a probe (contact terminal), an insulating film and an extraction interconnect and manufactured utilizing the manufacturing technology of a semiconductor integrated circuit device, of inserting a dummy metal film between the extraction interconnect and the probe (contact terminal) to form a space region, thereby adjusting the height of the probe (contact terminal).

SUMMARY OF THE INVENTION

For testing a semiconductor integrated circuit device, probe testing is performed. The probe testing includes a function test for confirming whether the device operates as a predetermined function, and a test for determining whether the device is a non-defective/defective product in accordance with the test results of DC operating characteristics and AC operating characteristics. In the probe testing, the test of the device is carried out while it is in the form of a wafer in order to meet the delivery in the wafer form (quality differentiation), to examine the quality of KGD (Known Good Die) (improvement in the yield of MCP (Multi-Chip Package)), and to satisfy the demand for total cost reduction.

In recent years, as semiconductor integrated circuit devices have many functions, a plurality of circuits tend to be formed on one semiconductor chip (which will hereinafter be called "chip" simply). In addition, in order to reduce the production cost of semiconductor integrated circuit devices, there is a tendency of miniaturizing semiconductor elements and interconnects to decrease the area of each chip, while increasing the number of chips available from one semiconductor wafer (which will hereinafter be called "wafer" simply). To respond to such a tendency, not only the number of test pads (bonding pads) is increased but also the test pads are arranged with a small pitch, and also an area of each test pad is reduced. When a prober having cantilever type probes is used for the probe testing, however, such a decreasing tendency of the pitch between test pads leads to difficulty in arrangement of the probes in accordance with the positions of the test pads.

The above-described problem that the test technology cannot catch up with the recent decreasing tendency of the pitch between pads is very serious. Even if an integrated circuit portion can be made smaller with the miniaturization of semiconductor elements as a result of improvement of semiconductor chip manufacturing technologies such as photolithography and etching, a whole chip size cannot be reduced efficiently owing to difficulty in decreasing the pitch between pads.

The present inventors have carried out an investigation on the technology capable of carrying out probe testing of chips whose test pads have been arranged with a small pitch by making use of a prober having a probe formed in accordance with the manufacturing technology of semiconductor integrated circuit devices. During the investigation, the present inventors have found further problems as described below.

Described specifically, the probe is a portion of a thin film probe in the sheet form formed, in accordance with the manufacturing technology of semiconductor integrated circuit devices, by depositing a metal film and a polyimide film and patterning thereof while using a wafer composed of silicon or the like as a frame material, and is provided on the side of the main surface of the thin film probe opposite to a chip to be tested. In the wafer serving as a frame material, portions in which probes are to be formed are anisotropically etched into a plurality of quadrangular pyramid holes having a side surface inclined at an angle of about 70.5° relative to the bottom surface (opening portion). The contour of each of these holes will be that of the probes.

The probes investigated by the present inventors each has a relatively low height of about 15 μm so that a foreign matter attached onto a wafer to be tested may presumably cause some inconveniences, for example, the foreign matter breaks the probe and the sheet therearound when it is brought into contact with the thin film probe and in addition, the foreign matter which has transferred from a wafer to be tested to the thin film probe may presumably have a contact with the wafer to be tested again and damage it.

As a countermeasure against such inconveniences, the present inventors studied the formation of deep holes in the wafer serving as a frame material. The holes are quadrangular pyramid ones formed by anisotropic etching as described above so that an increase in the depth of each hole enlarges the base (opening portion), which disturbs arrangement of the holes with a small pitch and thereby makes it difficult to form a plurality of probes with a small pitch.

In the technology disclosed by Japanese Patent Laid-Open No. 2006-118945, the dummy metal film is covered, at the circumference of the side surface thereof, with a polyimide film in order to prevent the dummy metal film from being etched in the manufacturing step of a prober. The presence of this polyimide film however makes it difficult to decrease the pitch of the probes (contact terminals) of the prober in accordance with the positions of the test pads of the chip arranged with a decreased pitch.

An object of the present invention is to provide a technology capable of promoting miniaturization of a semiconductor integrated circuit device.

Another object of the present invention is to provide a technology capable of improving the production yield of a semiconductor integrated circuit device.

A further object of the present invention is to provide a prober usable for pads arranged with a small pitch.

A still further object of the present invention is to provide a technology capable of preventing, during probe testing with a thin film probe having a probe formed by the manufacturing technology of a semiconductor integrated circuit device, breakage of both the thin film probe and a wafer to be tested.

The above-described objects and novel features of the present invention will be apparent by the description herein and accompanying drawings.

Typical inventions, of the inventions disclosed in the present application, will next be outlined briefly.

A method of manufacturing a semiconductor integrated circuit device comprises the steps of:

(a) supplying a semiconductor wafer having a plurality of chip formation regions each having a semiconductor integrated circuit and a plurality of electrodes electrically connected to the semiconductor integrated circuit;

(b) supplying a thin film probe sheet having a plurality of contact terminals which can be brought into contact with the plurality of electrodes of the semiconductor wafer and a pressing mechanism for bringing the contact terminals of the thin film probe sheet into contact with the electrodes of the semiconductor wafer;

(c) carrying out, by the aid of the pressing mechanism, electrical testing of the semiconductor integrated circuit by bringing the tips of the contact terminals of the thin film probe sheet into contact with the electrodes of the semiconductor wafer; wherein:

the thin film probe sheet has an insulating film formed over the contact terminals and having a plurality of through-holes, and a plurality of first interconnects to be electrically connected to the corresponding contact terminals via the through-holes;

the contact terminals each includes a first metal film and a second metal film stacked over the first metal film, the first metal film having an inclined surface portion extending toward the tip and a side surface portion extending upwards from the inclined surface portion and the second metal film having a first portion encompassed by the inclined surface portion and the side surface portion of the first metal film and a second portion protruding upwards from the side surface portion of the first metal film;

the insulating film is formed so as to cover the second portion of the second metal film and has, between the contact terminals, a back surface portion located above the side surface portion of the first metal film;

the first interconnects are connected to the second portion of the second metal film via the through-holes; and the electrical testing is carried out while keeping a height defined by the semiconductor wafer and the back surface portion of the insulating film.

Advantages available by the typical inventions, of the inventions disclosed by the present application, will next be described briefly.

It is possible to promote miniaturization of semiconductor integrated circuit devices and improve the production yield thereof.

DETAILED DESCRIPTION OF THE PREFERRED EMBODIMENTS

Figure 1:
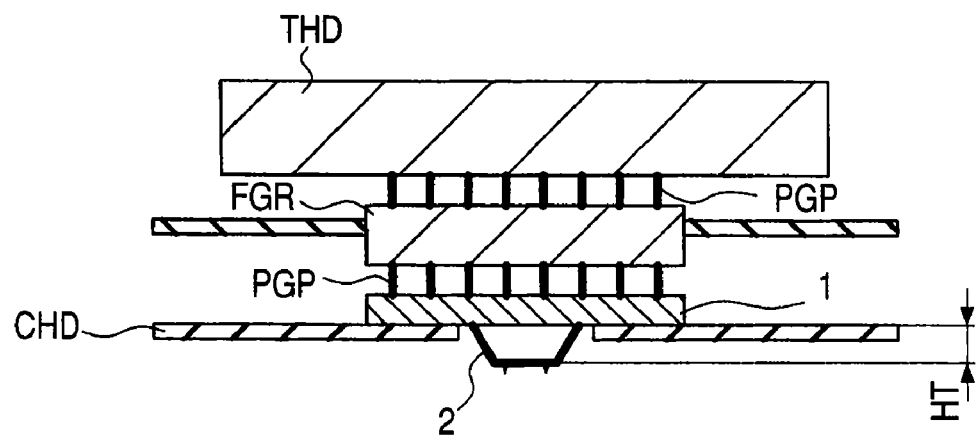
FIG. 1 is a fragmentary cross-sectional view of a probe card according to Embodiment 1 of the present invention.

Before describing the present invention in details, meanings of the terms used herein will next be explained.

The term "device surface" means a main surface of a wafer on which device patterns corresponding to a plurality of chip regions are to be formed by lithography.

The term "contact terminal" or "probe" means a needle, probe, protrusion or the like to be brought into contact with an electrode pad provided over each chip region for testing electrical properties.

The term "thin film probe (membrane probe)", "thin film probe card", or "protruding needle wiring sheet composite" means a thin film provided with the contact terminal (protruding needle) to be brought into contact with a test object as described above and an interconnect led around therefrom. This interconnect has an electrode for outside contact. The thin film probe or the like is a thin film having, for example, a thickness from about 10 μm to 100 μm and is integrally formed with an interconnect layer and a tip portion (contact terminal) electrically connected thereto by a patterning method in which wafer processes such as photolithography, CVD (Chemical Vapor Deposition), sputtering and etching similar to those employed for the manufacture of a semiconductor integrated circuit by using silicon wafer are used in combination. It is also possible to form some portions in advance and then integrate them with the other portions, which however makes the process complicated.

The term "probe card" means a structure having a contact terminal to be brought into contact with a wafer to be tested and a multilayer wiring substrate, and the term "prober" or "semiconductor testing apparatus" means a testing apparatus having a frog ring, a probe card and a sample supporting system including a wafer stage on which and a wafer to be tested is mounted.

The term "probe testing" means an electrical test to be carried out, by the aid of a prober, for a wafer after completion of a wafer step. The electrical test of a semiconductor integrated circuit is conducted by pressing a tip of the contact terminal against an electrode formed on the main surface of a chip region. A function test is conducted for confirming whether the circuit operates in accordance with a predetermined function or not or a test of DC operation characteristic and an AC operation characteristic is carried out for determining whether the wafer is a defective/non-defective product or not. The probe testing is distinguished from a selection test (final test) which is carried out after a wafer is divided into individual chips (or after completion of packaging).

The term "POGO pin" or "spring probe" means a contact needle which has a structure of pressing a contact pin (plunger (contact needle)) to an electrode (terminal) by an elastic force of a spring (coil spring) and is electrically connected to the electrode as needed. The elastic force is transmitted to the contact pin, for example, by the spring arranged inside of a metal tube (holding member) via a metal ball.

The term "tester (Test System)" means a system for electrically testing a semiconductor integrated circuit and it generates a predetermined voltage and a signal such as timing signal serving as a reference one.

The term "tester head" means a device which is electrically connected to a tester, receives a voltage and a signal transmitted therefrom, generates a voltage and a detailed signal such as timing signal to a semiconductor integrated circuit, and transmits the signal to a probe card via a POGO pin or the like.

The term "frog ring" means a ring which is electrically connected to a tester head and a probe card via a POGO pin and transmits a signal, which has been transmitted from a tester head, to a probe card which will be described later.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or principally apparent that the number is limited to the specific number.

Moreover in the below-described embodiments, it is needless to say that the constituting elements (including element steps) are not always essential unless otherwise specifically indicated or principally apparent that they are essential. In addition, it is needless to say that referring to constituting elements used in Examples and the like, the term "made of" or "composed of" does not exclude the other elements unless otherwise specifically indicated that the constituting element is limited to only the specific element.

Similarly, in the below-described embodiments, when a reference is made to the shape or positional relationship of the constituting elements, that substantially analogous or similar to it is also embraced in the present invention unless otherwise specifically indicated or principally apparent that it is not. This also applies to the above-described value and range.

Further, when a reference is made to a material, a specified material is a main material and a secondary element, additive, addition element or the like is not excluded unless otherwise principally apparent or apparent judging from the situation that it is not. For example, a silicon member is not only a pure silicon member but also may contain an additive impurity or may be a binary or ternary alloy (for example, SiGe) containing silicon as a principal element unless otherwise specifically indicated.

In all the drawings for describing the embodiments, like members of a function will be identified by like reference numerals and overlapping descriptions will be omitted.

Further, in all of the drawings employed in the embodiments, even a plan view may be hatched partially to facilitate understanding thereof.

Embodiments of the present invention will next be described specifically based on accompanying drawings.

EMBODIMENT 1

FIG. 1 is a fragmentary cross-sectional view of a probe card according to Embodiment 1. As illustrated in FIG. 1, the probe card of Embodiment 1 is made of a multilayer wiring substrate 1, a thin film sheet (thin film probe sheet) 2, a tester head THD, a frog ring FGR, a card holder CHD and the like. The tester head THD and the frog ring FGR as well as the frog ring FGR and the multilayer wiring substrate 1 are electrically connected respectively via pluralities of POGO pins PGP, whereby the tester head THD and the multilayer wiring substrate 1 are electrically connected. The card holder CHD mechanically connects the multilayer wiring substrate 1 to a prober and has a mechanical strength enough to prevent the multilayer wiring substrate 1 from being warped by a pressure from the POGO pin PGP.

Figure 2:
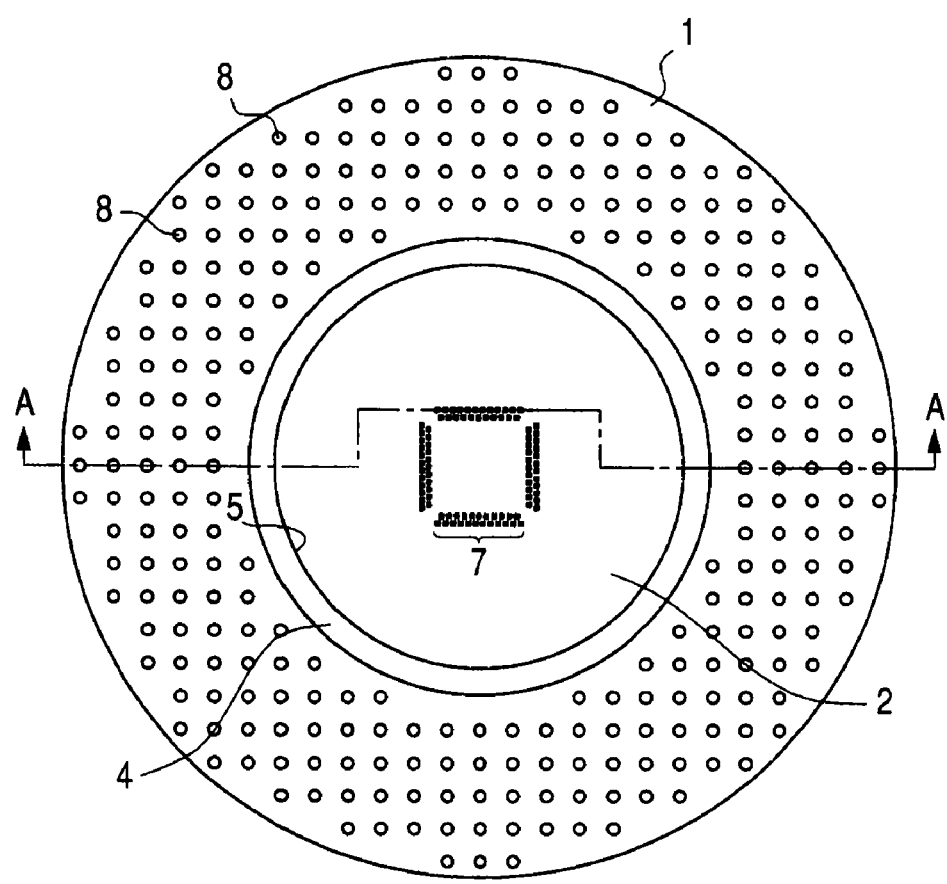
FIG. 2 is a fragmentary plan view of the lower surface of the probe card according to Embodiment 1 of the present invention.
Figure 3:
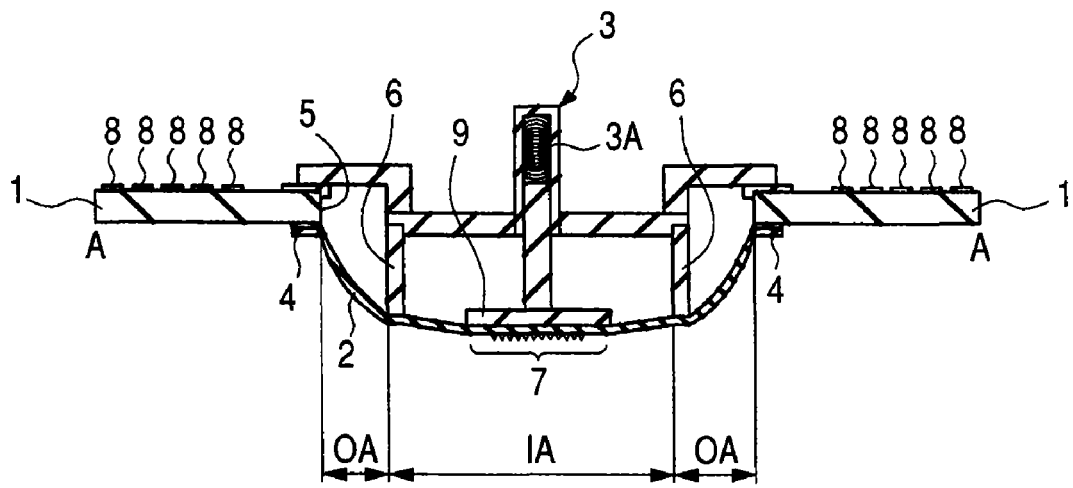
FIG. 3 is a cross-sectional view taken along a line A-A of FIG. 2.

FIG. 2 is a fragmentary plan view of a lower surface of the probe card of Embodiment 1, while FIG. 3 is a cross-sectional view taken along a line A-A of FIG. 2.

As illustrated in FIG. 2 and FIG. 3, the probe card of this Embodiment includes, for example, a plunger 3 in addition to the members shown in FIG. 1. The thin film sheet 2 is fixed to the lower surface of the multilayer wiring substrate 1 by a hold ring 4, and the plunger 3 is attached to the upper surface of the multilayer wiring substrate 1. The multilayer wiring substrate 1 has, at the center portion thereof, an opening portion 5 and inside this opening portion 5, the upper surface (third main surface) of the thin film sheet 2 adheres to the plunger 3 via an adhesion ring (ring-shaped jig) 6.

The thin film sheet 2 has, on the lower surface (second main surface) thereof a plurality of probes (contact terminals) 7, for example, having a shape of a quadrangular pyramid or trapezoidal pyramid. The thin film sheet 2 has, inside thereof, a plurality of interconnects which are electrically connected to the respective probes 7 and extend from the respective probes 7 to deep portions of the thin film sheet 2. The multilayer wiring substrate 1 has, on the lower surface or upper surface thereof, a plurality of receiving portions (not illustrated) in electric contact with the respective end portions of the plurality of interconnects. The plurality of receiving portions are electrically connected to a plurality of POGO seats 8 provided on the upper surface of the multilayer wiring substrate 1 via interconnects (third interconnects) formed inside the multilayer wiring substrate 1. This POGO seat 8 has a function of receiving a pin which introduces a signal from a tester to the probe card.

In Embodiment 1, the thin film sheet 2 is made of a thin film, for example, including polyimide as a principal component. Since such a thin film sheet 2 has flexibility, the probe card according to Embodiment 1 has a structure in which the thin film sheet 2 of a region having the probes 1 formed thereover is pressed downwards by the plunger 3 via a pressing tool (pressing mechanism) 9 in order to bring all the probes 7 into contact with the pads of a chip (semiconductor integrated circuit device). In short, a constant pressure is applied to the pressing tool 9 by making use of an elastic force of a spring 3A placed inside the plunger 3. In this Embodiment, 42 alloy can be exemplified as a material of the pressing tool 9.

With an increase in the number of test pads (bonding pads) formed on the surface of the chip to be tested, the number of the POGO pins PGP for transmitting signals to the respective test pads increases. The increase in the number of the POGO pins PGP leads to a rise in the pressure from the POGO pins PGP applied to the multilayer wiring substrate 1. The card holder CHD therefore needs to be thickened in order to prevent the warpage of the multilayer wiring substrate 1. When the probe card has a structure in which a tension is applied to each of a center area IA (refer to FIG. 3) of the thin film sheet 2 and an outer circumferential region OA (refer to FIG. 3) which surrounds the center region IA therewith and lies on the outer circumferential side with the adhesion ring as a boundary in order to bring each probe 7 formed on the thin film sheet 2 into contact with the corresponding test pad without omission, a height HT (refer to FIG. 1) from the surface of the multilayer wiring substrate 1 to the probe surface of the thin film sheet 2 is limited. When the thickness of the card holder CHD exceeds the limit of the height HT, the thin film sheet 2 is inevitably embedded in the card holder CHD. There is therefore a fear of failing to bring the probes 7 into contact with the test pads without omission.

In Embodiment 1, the thin film sheet 2 and the adhesion ring 6 are bonded while applying a tension only to the center region IA of the thin film sheet 2 without applying a tension to the outer circumferential region OA. In this case, for example, a metal (for example, 42 alloy) having a thermal expansion coefficient substantially equal to that of Si (silicon) is selected as the material of the adhesion ring 6 and an epoxy adhesive, for example, is used as an adhesive for bonding the thin film sheet 2 to the adhesion ring 6. This makes it possible to increase the height of the adhesion ring 6 which defines the height HT of the thin film sheet 2 to the probe surface and thereby raise the height HT. As a result, it is possible to avoid the thin film sheet 2 from being embedded in the card holder CHD. In other words, the probes 7 can be brought into contact with the test pads without omission even if the card holder CHD thickens.

Figure 4:
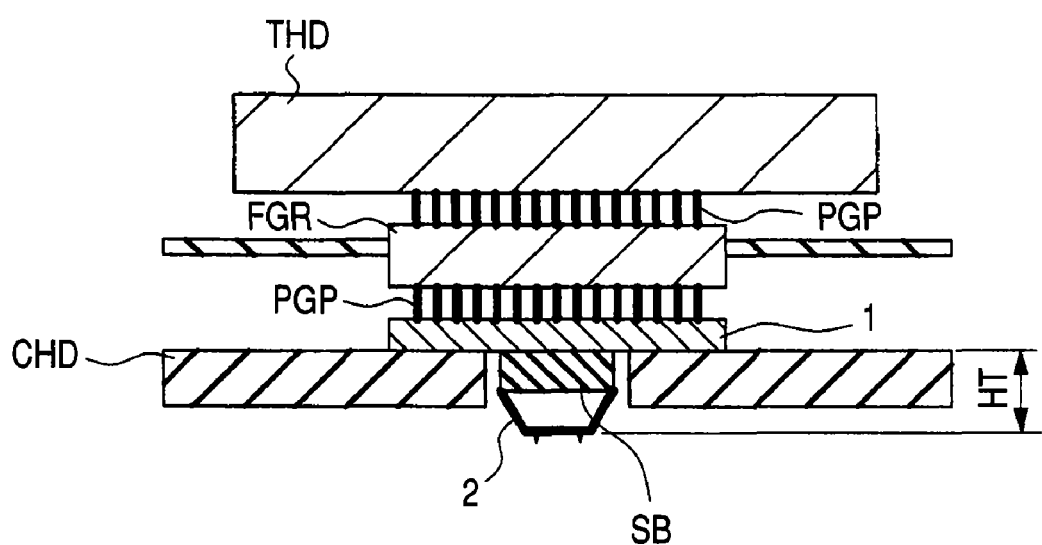
FIG. 4 is a fragmentary cross-sectional view of the probe card according to Embodiment 1 of the present invention.

Instead of using the above-described means, the height HT from the surface of the multilayer wiring substrate 1 to the probe surface of the thin film sheet 2 may be increased by attaching a subsidiary board SB to the center portion of the multilayer wiring substrate 1 and then attaching the thin film sheet 2 to the subsidiary board SB as shown in FIG. 4. As in the multilayer wiring substrate 1, the subsidiary board SB has, therein, a plurality of interconnects and moreover a plurality of receiving portions (not illustrated) to be brought into contact with the end portions of these interconnects. The receiving portions formed in the multilayer wiring substrate 1 and the receiving portions formed in the subsidiary board SB corresponding thereto are electrically connected via a solder, respectively. They may be electrically connected by, instead of using the solder, bonding the multilayer wiring substrate 1 and the subsidiary board SB under pressure via an anisotropic conductive rubber, or forming Cu-plated protruding portions to be electrically connected to the receiving portions on the respective surfaces of the multilayer wiring substrate 1 and subsidiary board SB to bond these protruding portions which correspond to each other under pressure.

Figure 5:
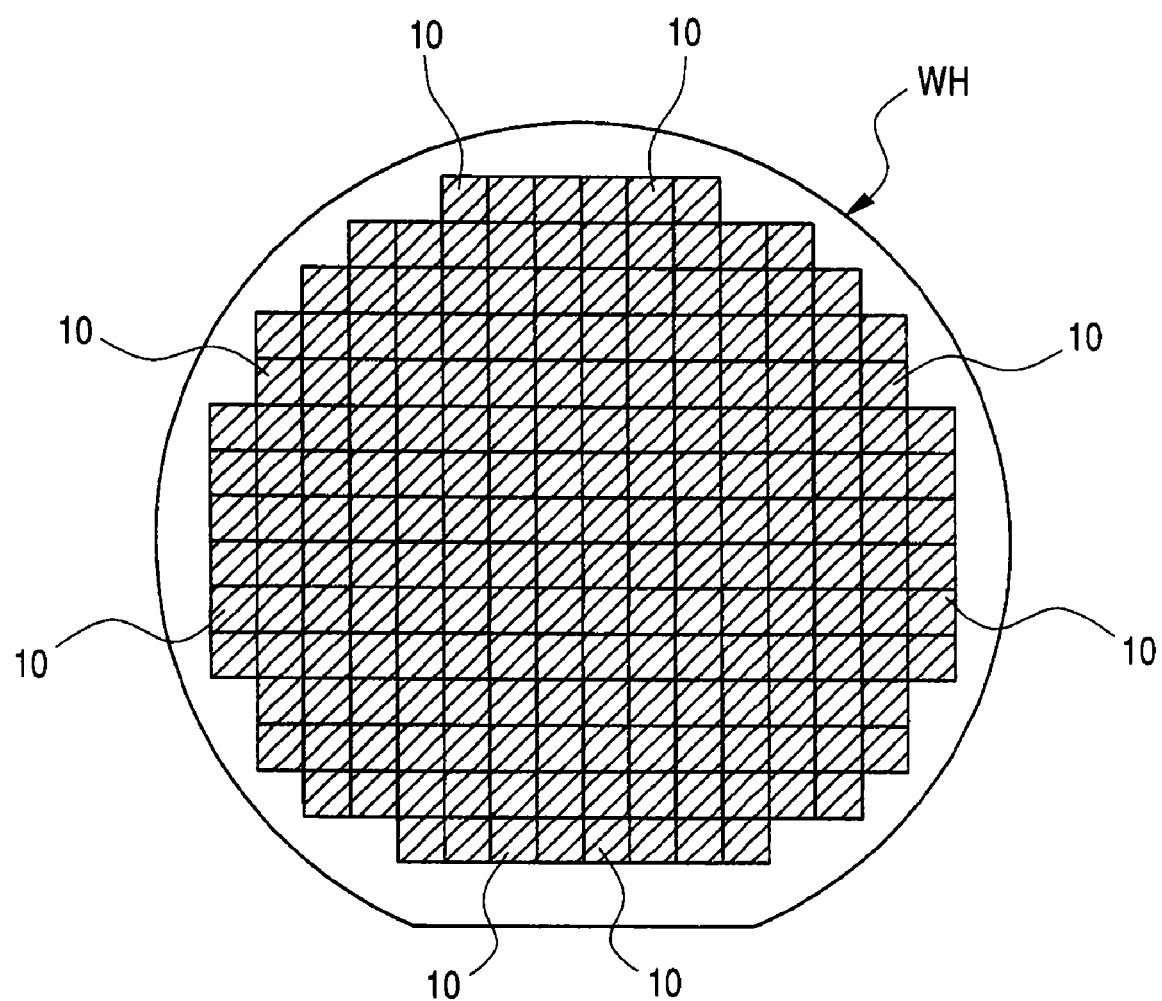
FIG. 5 is a plan view of a semiconductor wafer which has been divided into semiconductor chip regions to be subjected to probe testing using the probe card according to Embodiment 1 of the present invention.
Figure 6:
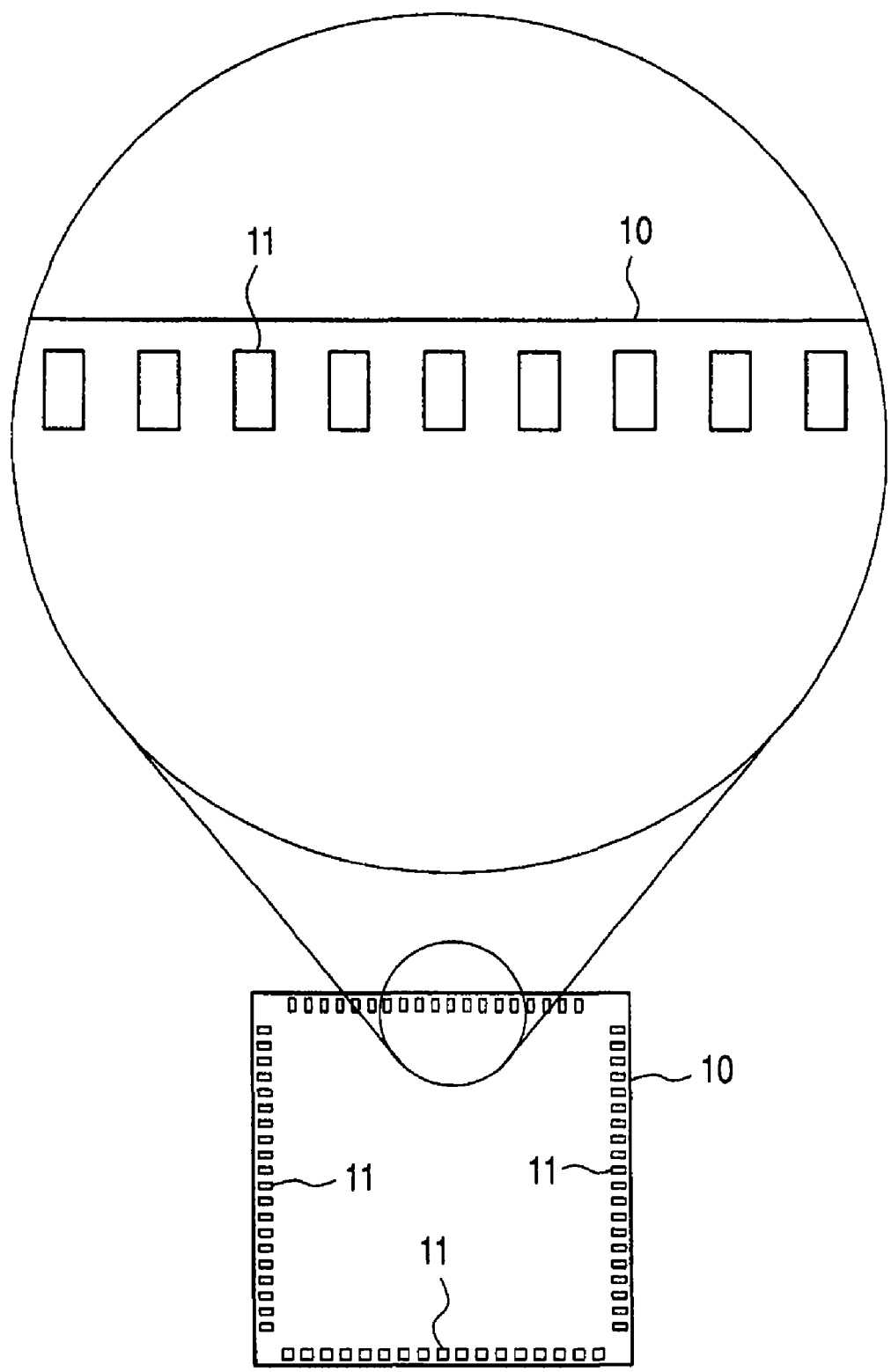
FIG. 6 is a plan view of the semiconductor chip to be subjected to probe testing using the probe card according to Embodiment 1 of the present invention.

In Embodiment 1, a chip to be subjected to probe testing (electrical testing) with the above-described probe card is, for example, a chip of an SoC (System on Chip) structure having thereon a semiconductor integrated circuit with a plurality of functions. FIG. 5 is a plan view of a wafer WH which has been divided into a plurality of chips (chip formation regions) 10. Probe testing with the probe card according to this Embodiment is carried out for the wafer WH which has been divided into the plurality of chips 10. FIG. 6 is a plan view of the chip 10 and an enlarged view of a portion thereof. The chip 10 is made of, for example, a single crystal silicon substrate. On the periphery of the main surface of the chip 10, many pads (electrodes) 11 to be electrically connected to the semiconductor integrated circuit formed in the chip are arranged.

The chip 10 can be prepared by forming various semiconductor integrated circuits and input/output terminals (bonding pads) in each of many chip regions formed on the main surface of the wafer, forming pads 11 on the input/output terminals by the above-described method, and then dicing the wafer, thereby separating it into individual chip regions. In Embodiment 1, the above-described probe testing is performed for individual chip regions prior to the dicing of the wafer. When the probe testing (step of bringing the pads 11 into contact with the probes 7) will hereinafter be described, the term chip(s) 10, means "chip region(s) before dicing of the wafer" unless otherwise specifically indicated.

Figure 7:
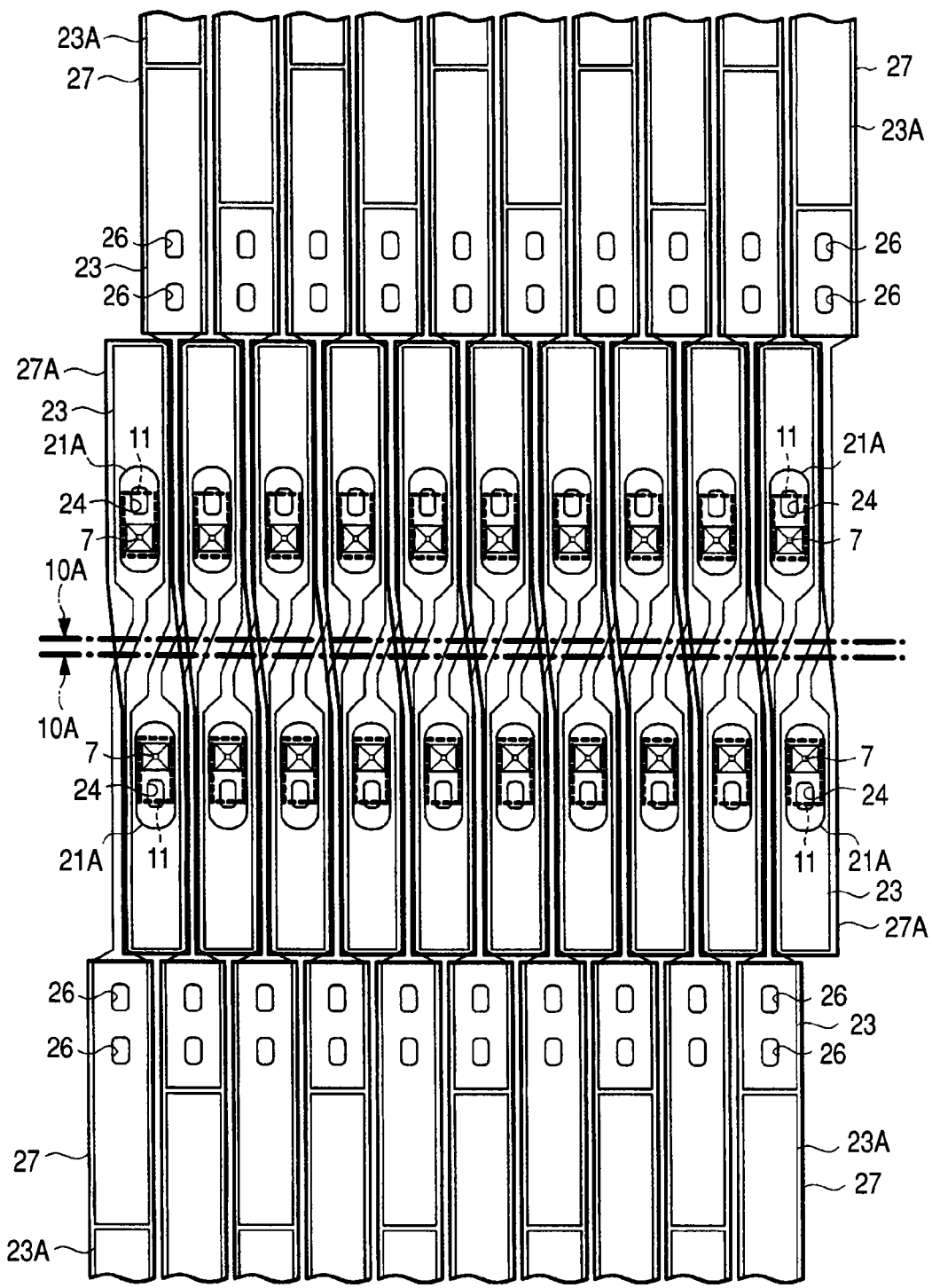
FIG. 7 is a fragmentary plan view of a thin film sheet constituting the probe card according to Embodiment 1 of the present invention.
Figure 8:
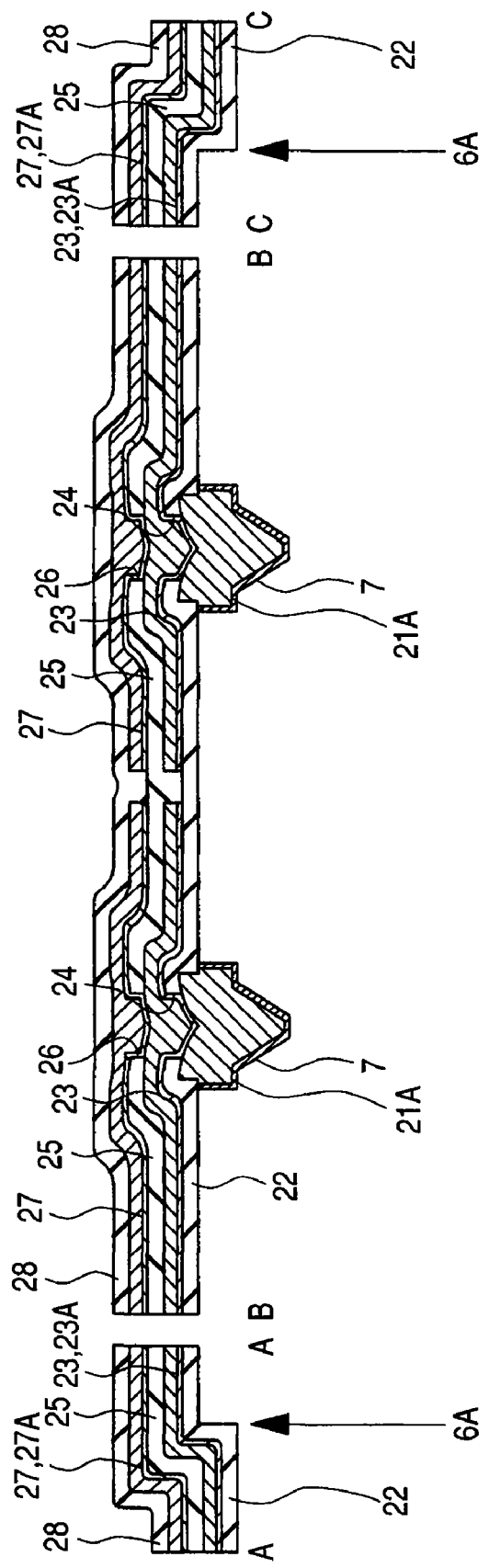
FIG. 8 is a fragmentary cross-sectional view of the thin film sheet constituting the probe card according to Embodiment 1 of the present invention.
Figure 9:
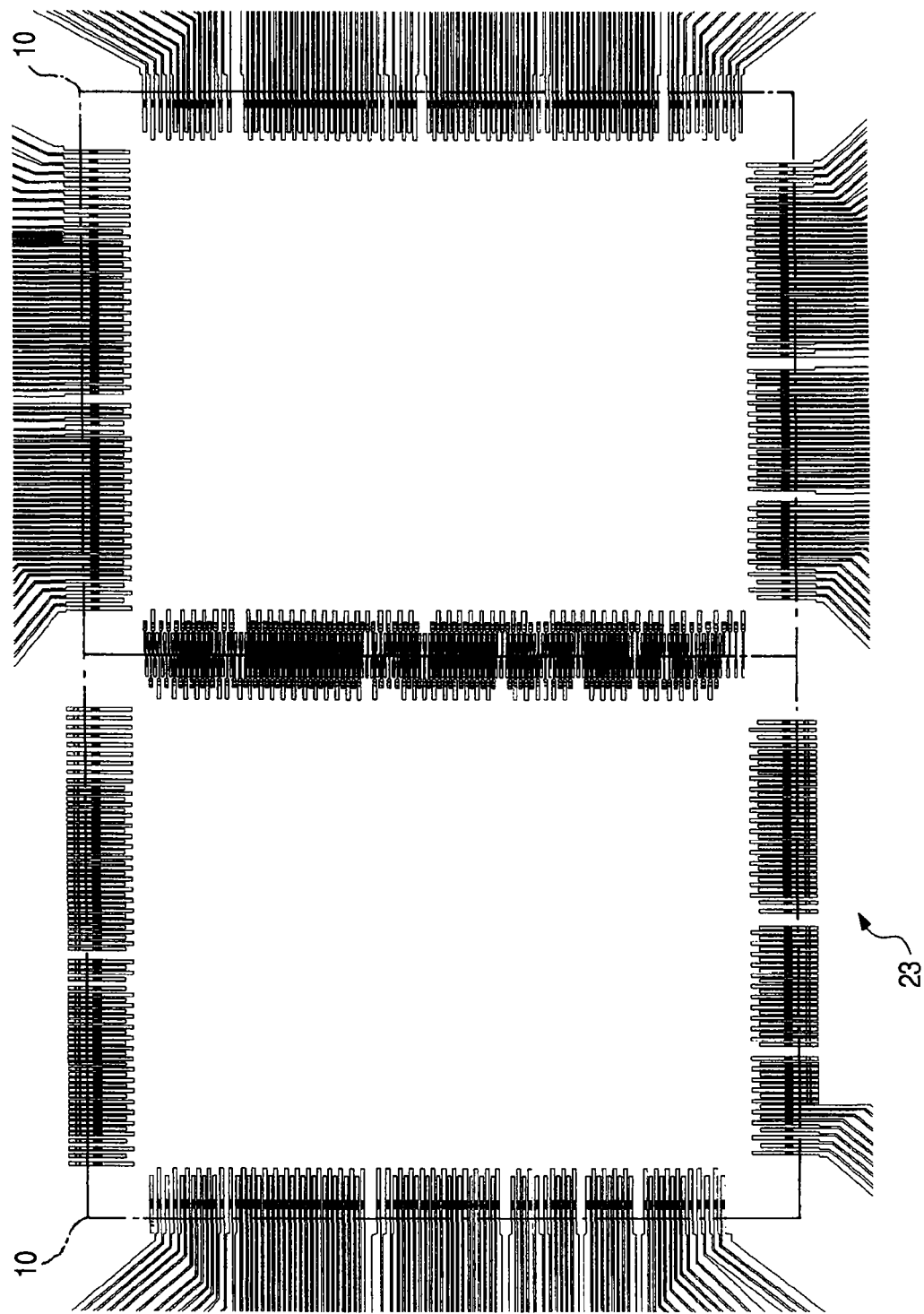
FIG. 9 is a fragmentary plan view of the thin film sheet constituting the probe card according to Embodiment 1 of the present invention.
Figure 10:
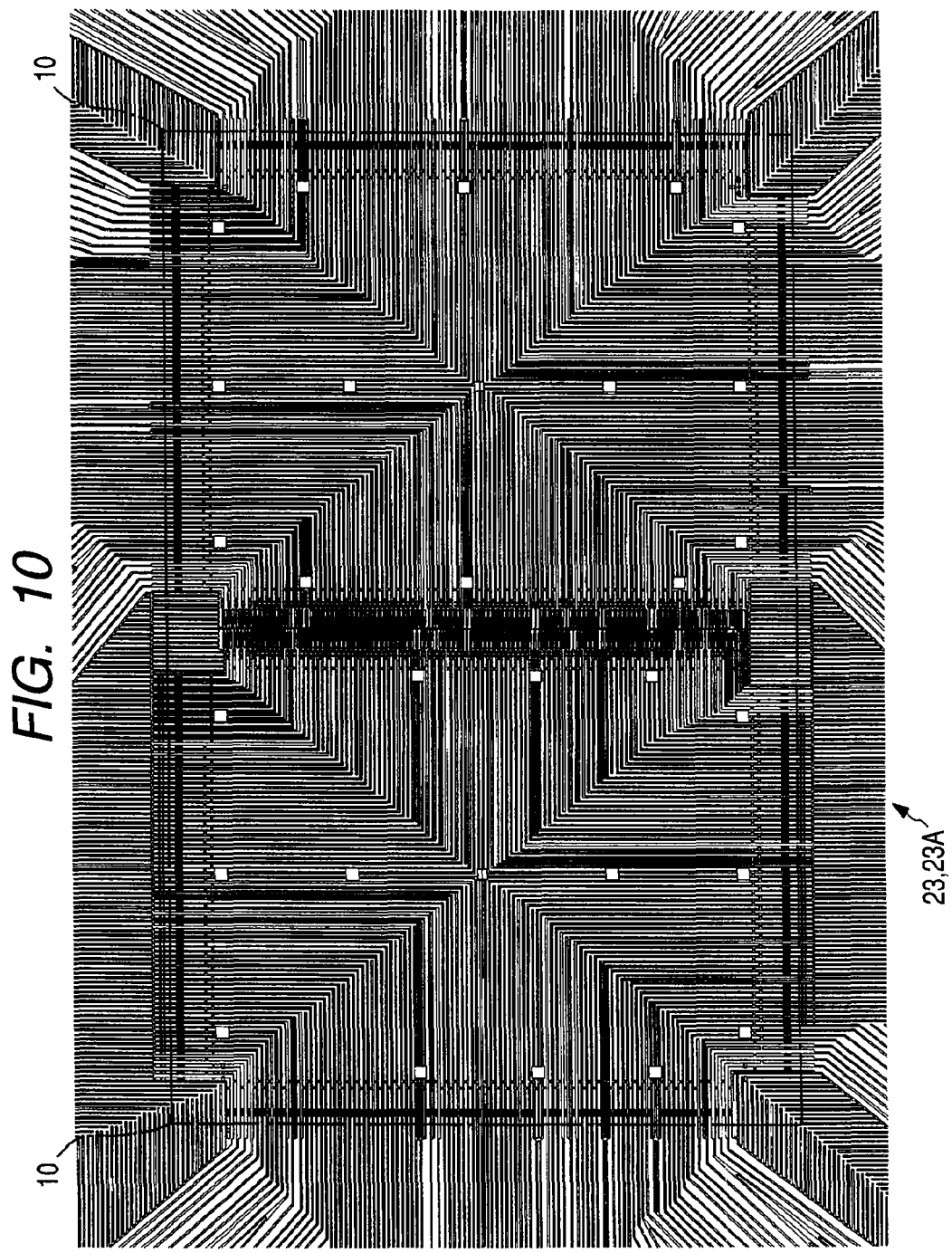
FIG. 10 is a fragmentary plan view of the thin film sheet constituting the probe card according to Embodiment 1 of the present invention.
Figure 11:
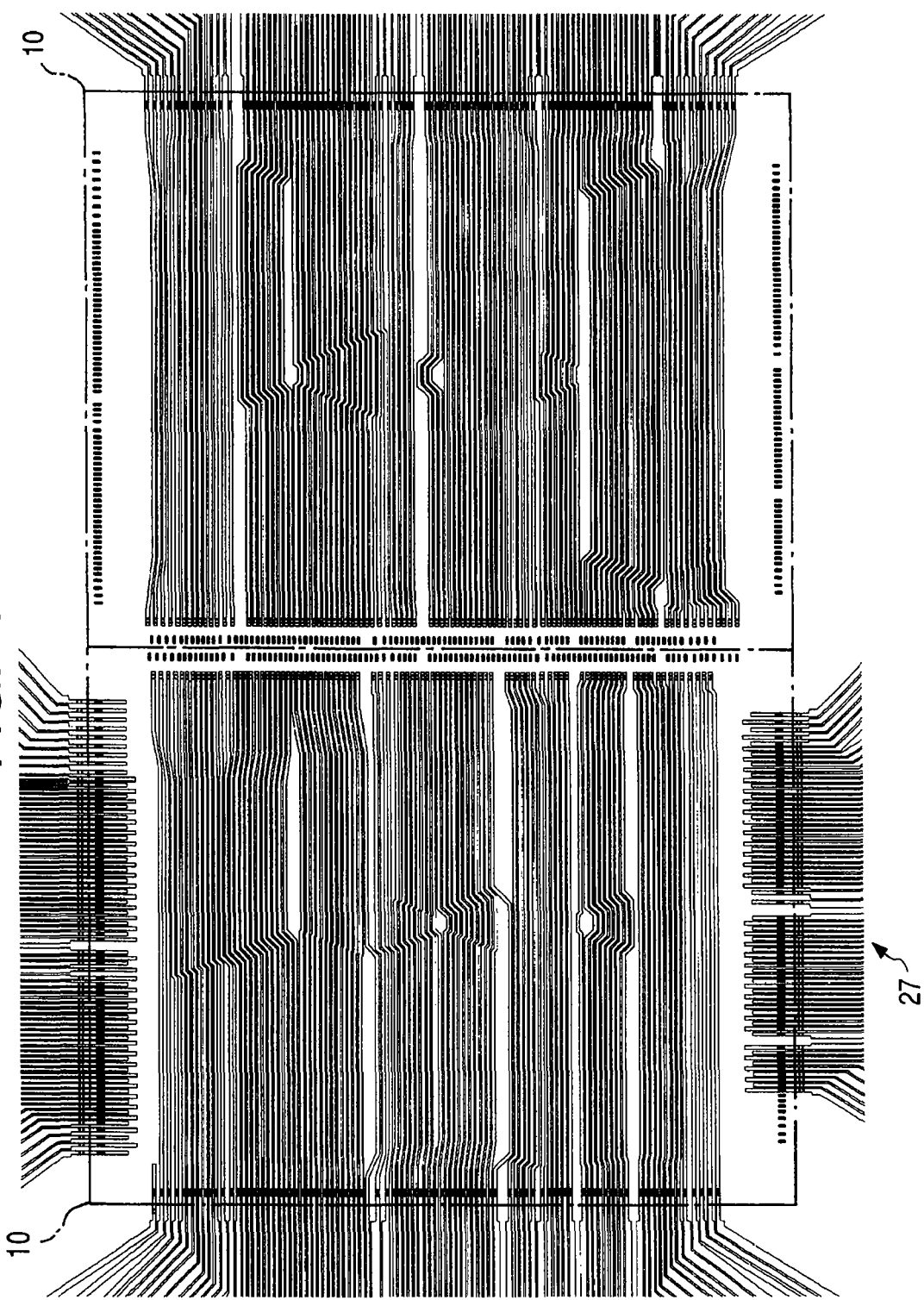
FIG. 11 is a fragmentary plan view of the thin film sheet constituting the probe card according to Embodiment 1 of the present invention.
Figure 12:
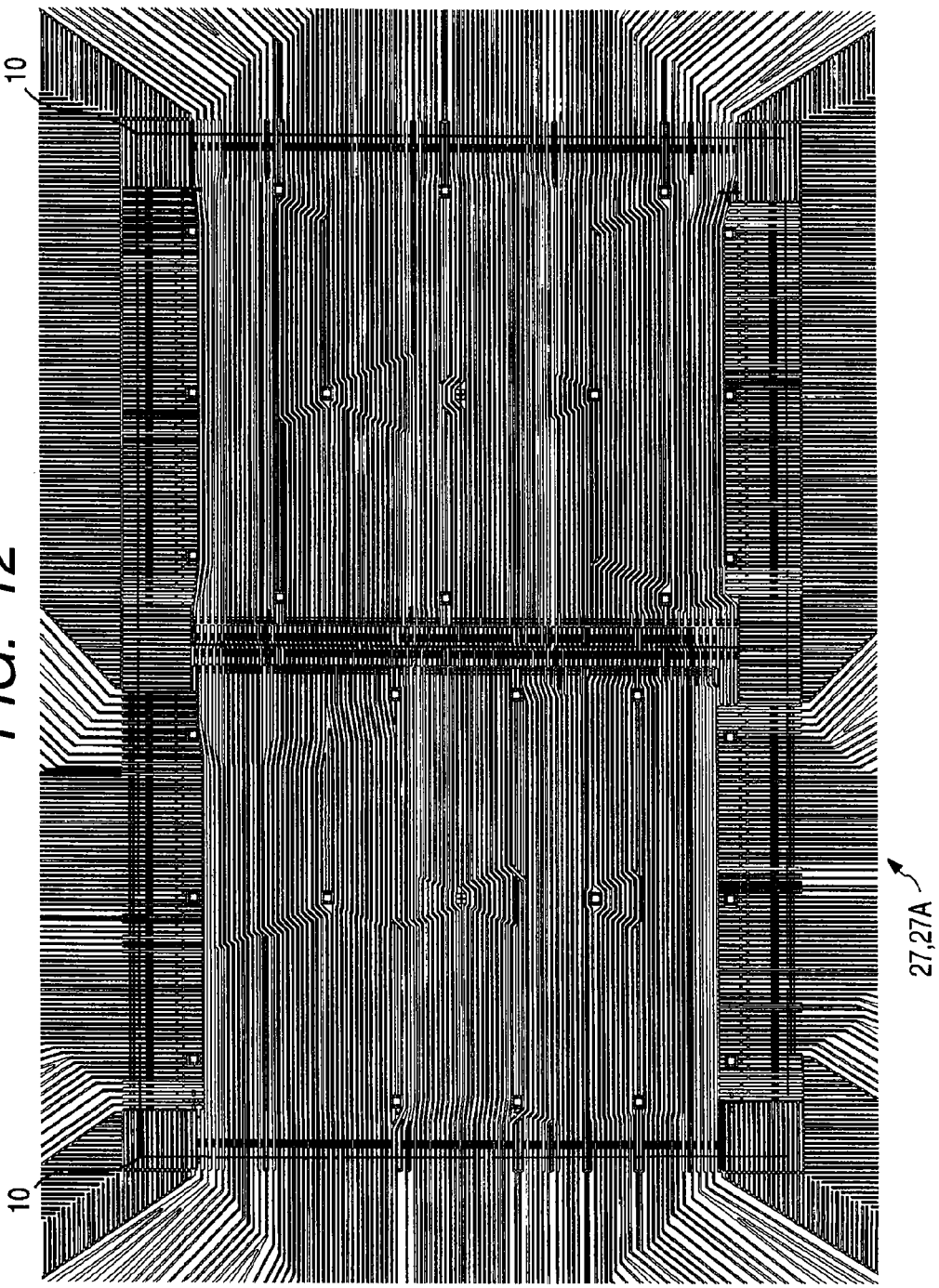
FIG. 12 is a fragmentary plan view of the thin film sheet constituting the probe card according to Embodiment 1 of the present invention.

FIG. 7 is a fragmentary plan view illustrating an enlarged portion of a region of the thin film sheet 2 in which the probes 7 have been formed; and FIG. 8 is a fragmentary cross-sectional view of the thin film sheet 2. In FIG. 8, the region in which the probes 7 have been formed is shown as a B-B region, and regions which lie below the adhesion ring 6 when the thin film sheet 2 is bonded to the adhesion ring 6 (refer to FIG. 3) of the probe card are shown as A-A region and C-C region.

The probes 7 are each a portion of a metal film 21A patterned in the thin film sheet 2 to have a quadrangular plan shape, and is a protruding portion of the metal film 21A in the form of a quadrangular pyramid or trapezoidal pyramid from the lower surface of the thin film sheet 2. The probes 7 are arranged on the main surface of the thin film sheet 2 in alignment with the pads 11 formed on the chip 10. In FIG. 7, arrangement of the probes 7 corresponding to the pads 11 (illustrated by a broken line in FIG. 7) is illustrated. In FIG. 7, a portion of the periphery 10A of each of the two chips 10 is also illustrated (illustrated by a dashed-dotted line).

The metal film 21A is formed by successively stacking a rhodium film and a nickel film one after another. A polyimide film (first insulating film) 22 is formed on the metal film 21A and an interconnect (first interconnect) 23 to be electrically connected to each metal film 21 is formed on the polyimide film 22. The interconnect layer including the interconnect 23 also includes an interconnect 23A not electrically connected to the metal film 21A. The interconnect 23 is brought into contact with the metal film 21A on the bottom of a through-hole (first through-hole) 24 formed in the polyimide film 22. Further, a polyimide film (second insulating film) 25 is formed on the polyimide film 22 and interconnects 23 and 23A. In the polyimide film 25, a through-hole (second through-hole) 26 reaching some of the interconnects 23 is selectively formed and an interconnect (second interconnect) 27 is formed on the polyimide film 22 so that it is brought into contact with the interconnect 23 on the bottom of the through-hole 26. An interconnect layer including the interconnect 27 also includes an interconnect 27A not electrically connected to the metal film 21A and interconnect 23. A polyimide film 28 is formed on the polyimide film 25 and interconnects 27 and 27A.

As illustrated in FIG. 8, the thin film sheet 2 has a step difference at positions 6A (refer to region A-A and region C-C) which will lie below the adhesion ring 6. At positions where such step difference has appeared, the thickness of the polyimide films 22, 25 and 28 becomes more uneven than the thickness of another portion. In addition, the thickness and width of the interconnects 23, 23A, 27 and 27A also become uneven, which causes a reduction in the mechanical stress of the thin film sheet 2 against the stress. In this Embodiment 1, application of a stress to this step-difference portion is avoided by attaching the adhesion ring 21 to the thin film sheet 2 at the portion where this step difference appears. This makes it possible to prevent the breakage of the thin film sheet 2, which will otherwise occur by the application of the stress, at the portion where the step difference appears. The reason why such a step difference is formed in the thin film sheet 2 and purpose of it will be described later when the manufacturing step of the thin film sheet 2 is described.

In Embodiment 1, probe testing is conducted simultaneously for two adjacent chips 10 opposite to each other with one side therebetween. FIGS. 9 to 12 are fragmentary plan views illustrating a region corresponding to two chips 10 to be tested. In these diagrams, a region encompassed with a dashed dotted line corresponds to the contour of the chip 10. FIGS. 9 to 12 illustrate a plane pattern of the interconnect 23 formed in the first-level interconnect layer; a plane pattern obtained by adding, to the plane pattern of FIG. 9, the interconnect 23A formed in the interconnect layer including the interconnect 23; a plane pattern of the interconnect 27 formed in a second-level interconnect layer; and a plane pattern obtained by adding, to the plane pattern of FIG. 11, the interconnect 27A formed in the interconnect layer including the interconnect 27, respectively. As described above, the interconnects 23A and 27A are not electrically connected to the metal film 21A.

The plane patterns shown in FIGS. 9 to 12 show one example of a routing channel for forming a multilayer interconnect of a thin film probe sheet. By assigning the actual interconnects 23 and 27 to the routing channel as needed, the probes 7 can be electrically connected to the corresponding pogo seats 8 (refer to FIG. 2) via the interconnects of the multilayer wiring substrate.

Some of the interconnects 23 electrically connected to the metal film 21A are led toward the periphery of the thin film sheet 2 and are electrically connected to the corresponding ones of a plurality of receiving portions placed on the multilayer wiring substrate 1 (refer to FIGS. 1 and 2). The other interconnects 23 are connected to the interconnects 27 and each of the interconnects 27 is led toward the periphery of the thin film sheet 2 and is electrically connected to the corresponding one of the plurality of receiving portions placed on the multilayer wiring substrate.

In Embodiment 1, the plane pattern of each interconnect in a region near the probes 7 is formed so as to overlap the interconnect 23 with the interconnect 27 electrically connected to the interconnect 23 or with the interconnect 27A not electrically connected to the interconnect 23. In addition, the plane pattern is formed so that both the interconnect 23 and interconnect 27 (or interconnect 27A) are arranged over the probes 7 (refer to FIG. 7). By forming such a plane pattern, the thin film sheet 2 can have uniform thickness over each of the probes 7, whereby a load to be applied to each of the probes 7 from a pressing tool 9 (refer to FIG. 3) can be made uniform at the time of probe testing. As a result, the probes 7 and the pads 11 (refer to FIGS. 6 and 7) corresponding thereto can be brought into better contact.

Furthermore, in Embodiment 1, interconnect patterns in each interconnect layer in the thin film sheet 2 are formed so as to make the distance between interconnects and density thereof uniform. For example, at a site where the distance between the interconnects 23 adjacent each other is too wide in the interconnect layer including the interconnects 23 therein, the distance and density of the interconnects can be made uniform by placing the interconnect 23A not electrically connected to the metal film 21A. The interconnect 23A can be formed simultaneously by a step of forming the interconnect 23. The above-described interconnect 27A is located at a site where the distance between the interconnects 27 adjacent to each other is too wide in the interconnect layer including the interconnects 27 therein. The distance of the interconnects and density thereof in this interconnect layer can be made uniform by placing the interconnect 27A therein (refer to FIG. 7). By forming an interconnect pattern in such a manner so as to place interconnects with a uniform distance and uniform density in each interconnect layer in the thin film sheet 2, the rigidity and thickness of the thin film sheet 2, especially in the vicinity of the probes 7, can be made uniform. This makes it possible to prevent generation of wrinkles and deflection of the thin film sheet 2 in the vicinity of the probes 7, thereby providing improved contact between the probes 7 and pads 11 corresponding thereto.

The manufacturing steps of the thin film sheet 2 of this Embodiment will next be described based on FIGS. 13 to 24. Of FIGS. 13 to 24, FIGS. 13, 16, 20 and 22 are fragmentary plan views of regions corresponding to those of FIG. 7 in respective manufacturing steps, while FIGS. 14, 15, 17, 18, 19, 21, 23 and 24 are fragmentary cross-sectional views illustrating regions corresponding to those of FIG. 8 in respective manufacturing steps.

Figure 13:
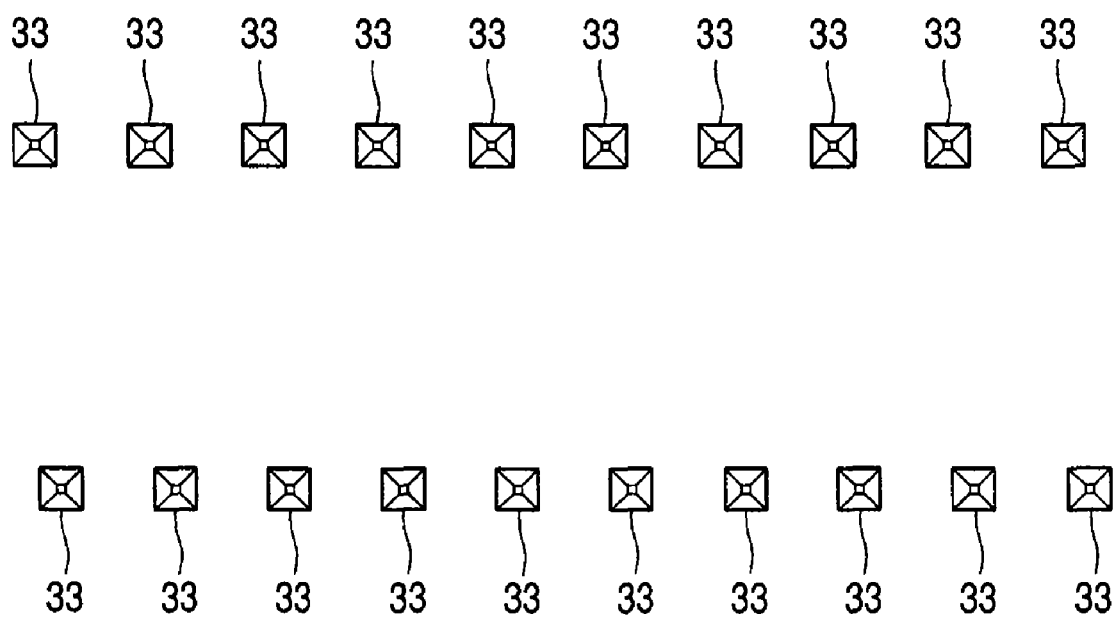
FIG. 13 is a fragmentary plan view explaining a fabrication process of the thin film sheet constituting the probe card according to Embodiment 1 of the present invention.
Figure 14:
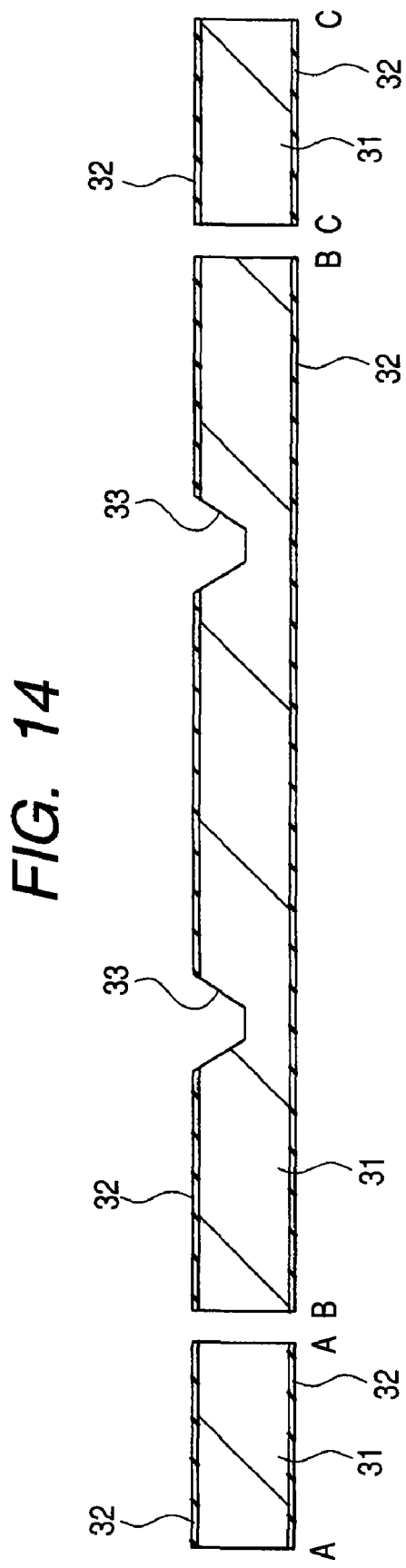
FIG. 14 is a fragmentary cross-sectional view explaining the fabrication process of the thin film sheet constituting the probe card according to Embodiment 1 of the present invention.

As illustrated in FIGS. 13 and 14, a wafer (first wafer) 31 having a thickness from about 0.2 mm to 0.8 mm and made of silicon is prepared and a silicon oxide film 32 of about 0.5 µm thick is formed on both sides of this wafer 31 by thermal oxidation. With a photoresist film as a mask, the silicon oxide film 32 on the main surface (first main surface) side of the wafer 31 is etched to form an opening portion reaching the wafer 31 in the silicon oxide film 32 on the main surface side of the wafer 31. With the remaining silicon oxide film 32 as a mask, the wafer 31 is anisotropically etched with an aqueous solution of a strong alkali (for example, an aqueous solution of potassium hydroxide) to form a quadrangular pyramid-shaped or trapezoidal pyramid-shaped hole (first hole portion) 33 encompassed by the (111) plane on the main surface of the wafer 31.

Figure 15:
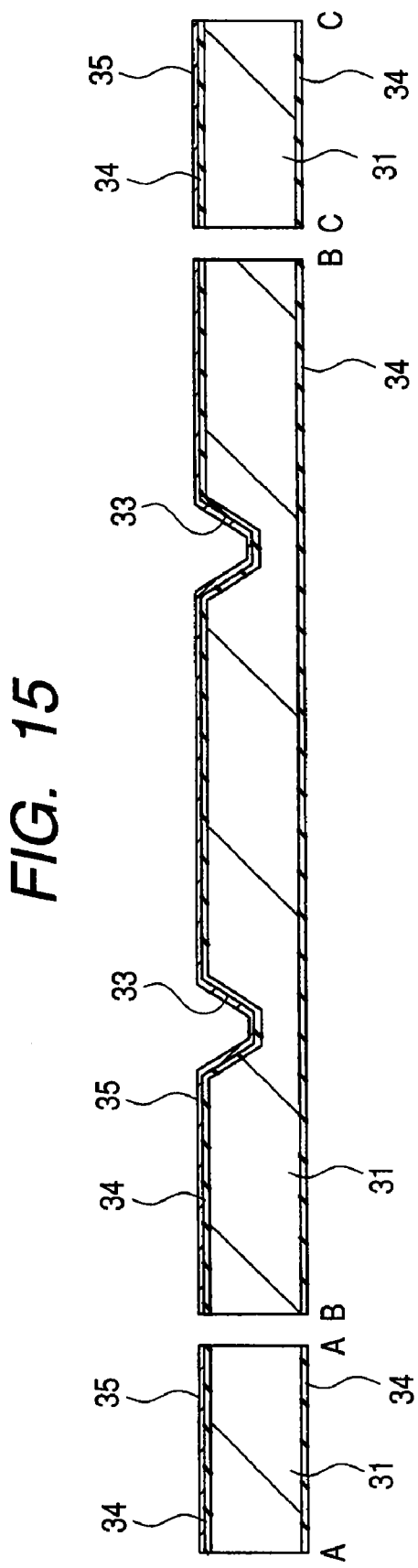
FIG. 15 is a fragmentary cross-sectional view of the thin film sheet during a fabrication step following that of FIG. 14.

As illustrated in FIG. 15, the silicon oxide film 32 used as a mask for the formation of the hole 33 is removed by wet etching with a mixture of hydrofluoric acid and ammonium fluoride. The wafer 31 is then thermally oxidized to form a silicon oxide film 34 of about 0.5 µm thick all over the wafer 31 including the inside of the hole 33. A conductive film 35 is then formed over the main surface of the wafer 31 including the inside of the hole 33. This conductive film 35 can be formed, for example, by successively depositing a chromium film of about 0.1 µm thick and a copper film of about 1 µm thick by sputtering or vapor deposition.

Figure 16:
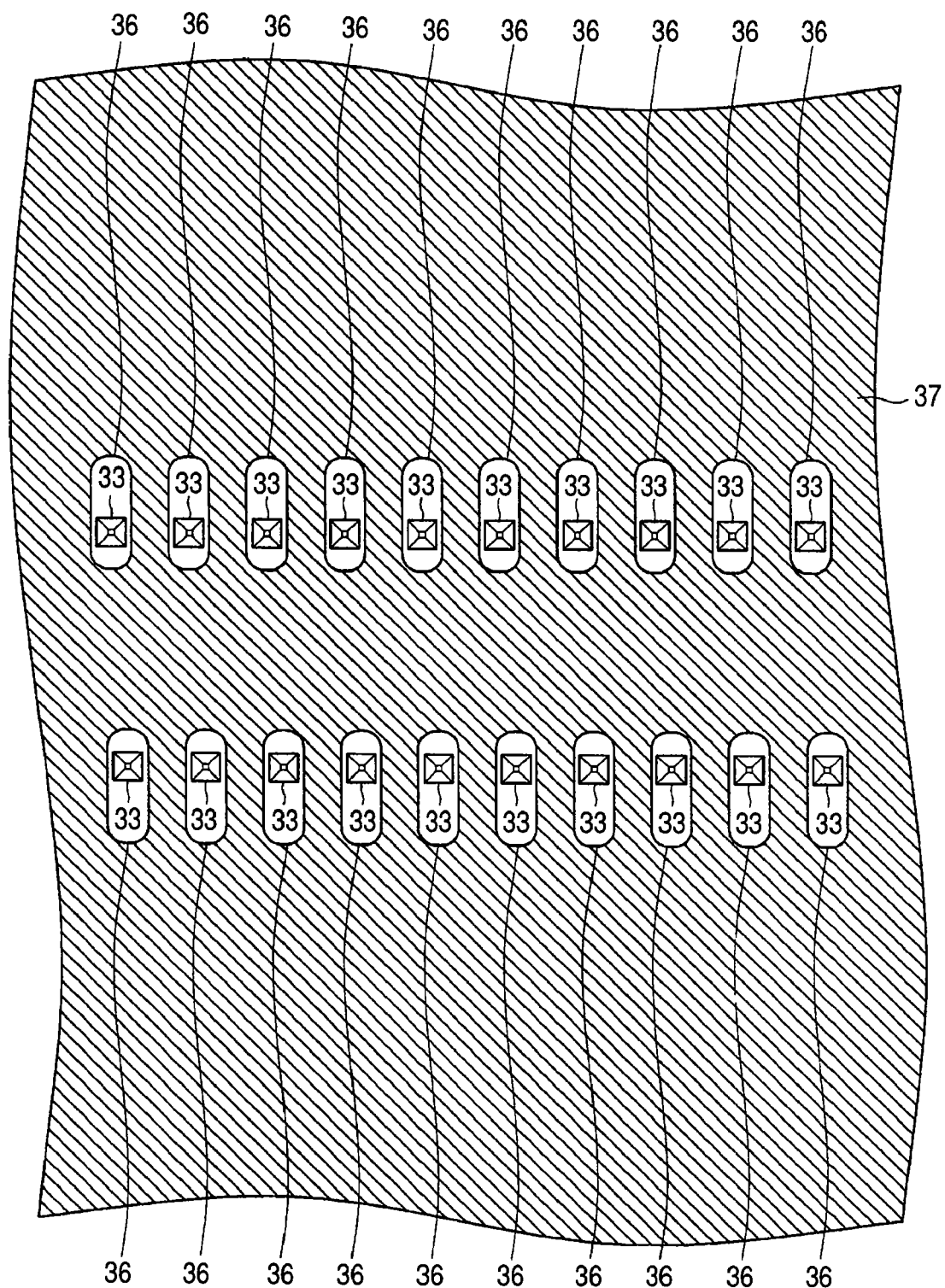
FIG. 16 is a fragmentary plan view illustrating the thin film sheet constituting the probe card according to Embodiment 1 of the present invention during a fabrication step thereof.
Figure 17:
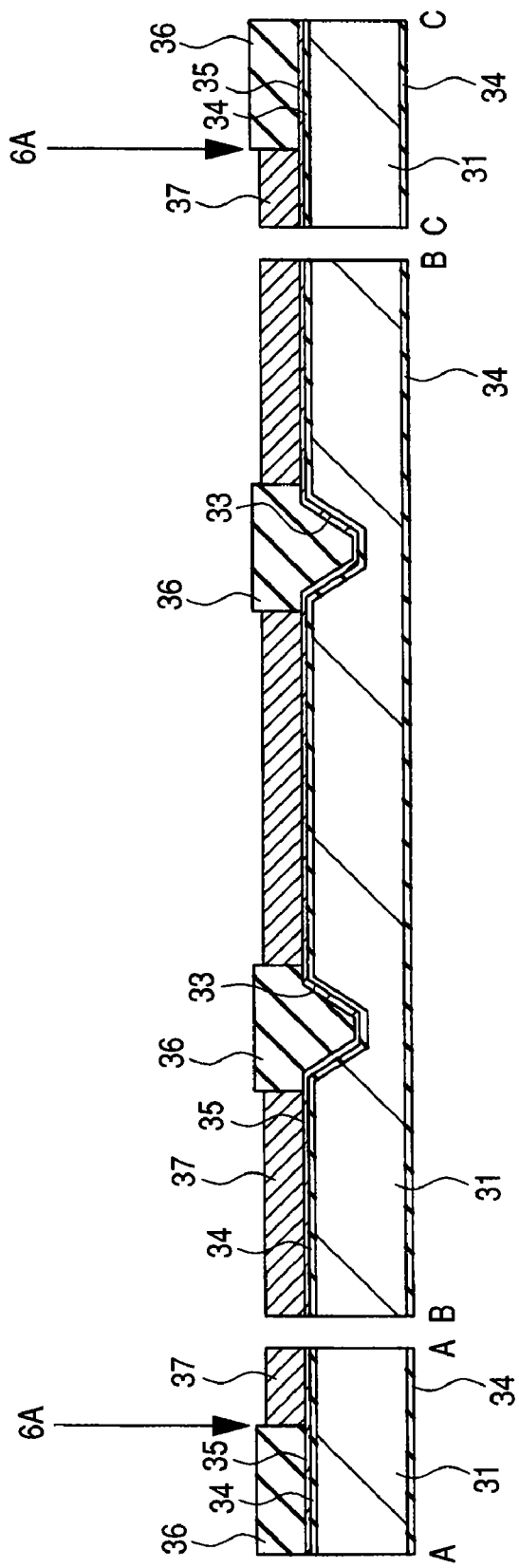
FIG. 17 is a fragmentary cross-sectional view of the thin film sheet during a fabrication step following that of FIG. 15.

As illustrated in FIGS. 16 and 17, with a photoresist film (first masking film) 36 patterned by photolithography as a mask, a copper film (first thin film) 37 from about 10 µm to 20 µm thick is deposited selectively over a region (first region) of the main surface of the wafer 31 where the photoresist film 36 is not present. At the time of this deposition, the photoresist film covers therewith a region (refer to FIGS. 7 and 8) in which the above-described metal film 21A is to be formed and a region (a region outside the position 6A (also refer to FIG. 8) which will lie below the adhesion ring 6)) to be outside the adhesion ring 6 when the probe card is fabricated. The copper film 37 can have a uniform thickness because it is formed by plating. This copper film 37 is a material having etch selectivity relative to the surface metal of the probes 7 and polyimide film 22.

It should be noted that the copper film 37 is omitted from the plan views for explaining the subsequent steps in order to facilitate the understanding of the constitution of each member.

Figure 18:
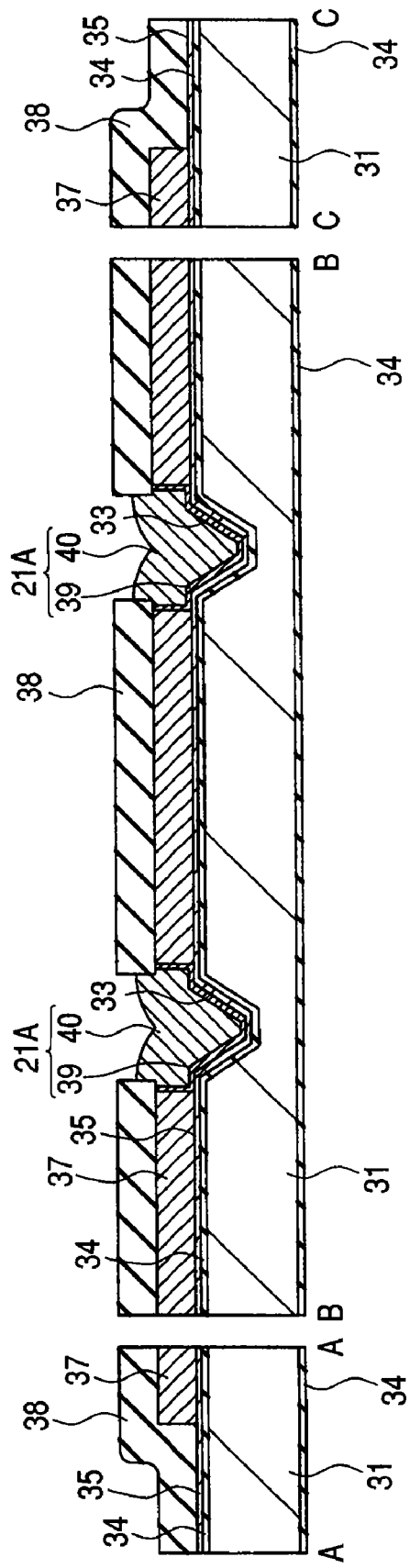
FIG. 18 is a fragmentary cross-sectional view of the thin film sheet during a fabrication step following that of FIG. 17.

As illustrated in FIG. 18, after removal of the photoresist film 36, a photoresist film (second masking film) 38 is formed over the main surface of the wafer 31. The photoresist film 38 is then removed by photolithography from a region (also refer to FIGS. 7 and 8) in which a metal film 21A is to be formed in the later step to form an opening portion.

A conductive film (first metal film) 39 having a high hardness and a conductive film (second metal film) 40 are then deposited successively on the conductive film 35 which has appeared from the bottom of the opening portion of the photoresist film 38 by electroplating with the conductive film 35 as an electrode. In this Embodiment, for example, a rhodium film is employed as the conductive film 39 and a nickel film is used as the conductive film 40. As a result of the steps so far described, the above-described metal film 21A composed of the conductive films 39 and 40 can be formed. The conductive films 39 and 40 in the hole 33 will serve as the above-described probe 7. The conductive film 35 will be removed by the step which will be described later.

In the metal film 21A, the conductive film 39 made of a rhodium film will become a surface when the probe 7 is formed by the later step and the conductive film 39 will have direct contact with the pad 11 of the chip 10. It is therefore preferred to select the material of the conductive film 39 from those having high hardness and excellent abrasion resistance. Since the conductive film 39 has direct contact with the pad 11, the shavings of the pad 11 with the probe 7 attaches to the conductive film 39 and requires a cleaning step for removing the dust. There is a fear of the probe testing step being protracted by it undesirably. For the conductive film 39, a material which is resistant to the attachment of the material of the pad 11 is therefore preferred. In Embodiment 1, a rhodium film capable of satisfying these conditions is selected. This enables elimination of the cleaning step or reduction of the frequency of the cleaning step.

The conductive film 40 (nickel film) has lower hardness than the conductive film 39 (rhodium film). It is generally difficult to increase the thickness of films having high hardness such as rhodium film because their internal stress is high. Accordingly, in Embodiment 1, a two layer structure formed of a rhodium film having relatively high hardness and a nickel film having relatively low hardness is adopted as the structure of the probe 7.

Figure 19:
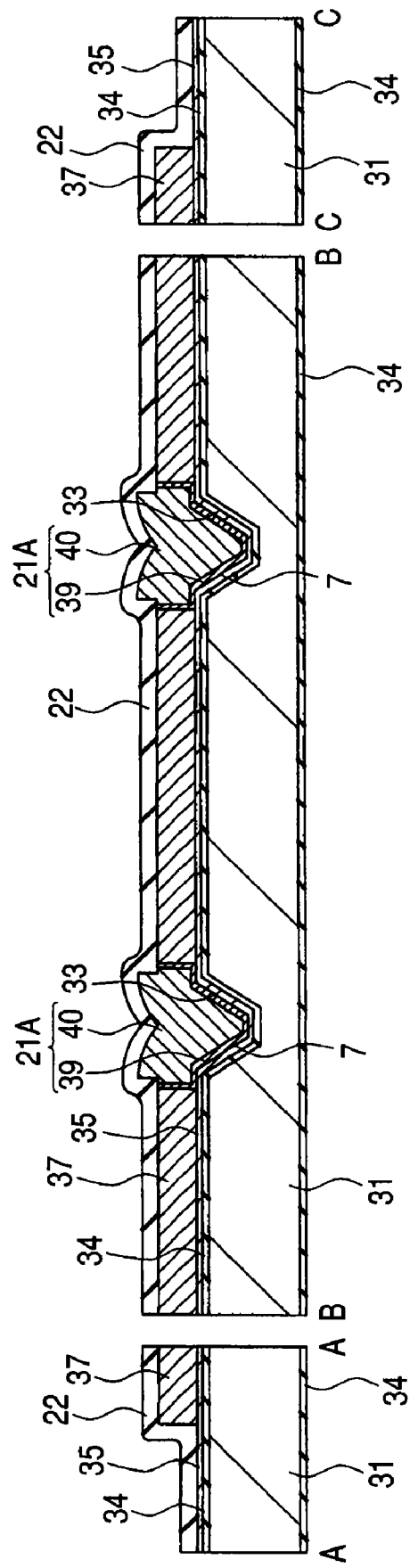
FIG. 19 is a fragmentary cross-sectional view of the thin film sheet during a fabrication step following that of FIG. 18.

After removal of the photoresist film 38 used for the formation of the metal film 21A (conductive films 39 and 40), a polyimide film 22 (also refer to FIG. 8) is formed so as to cover therewith the metal film 21A, conductive film 35 and copper film 37 as illustrated in FIG. 19.

Figure 20:
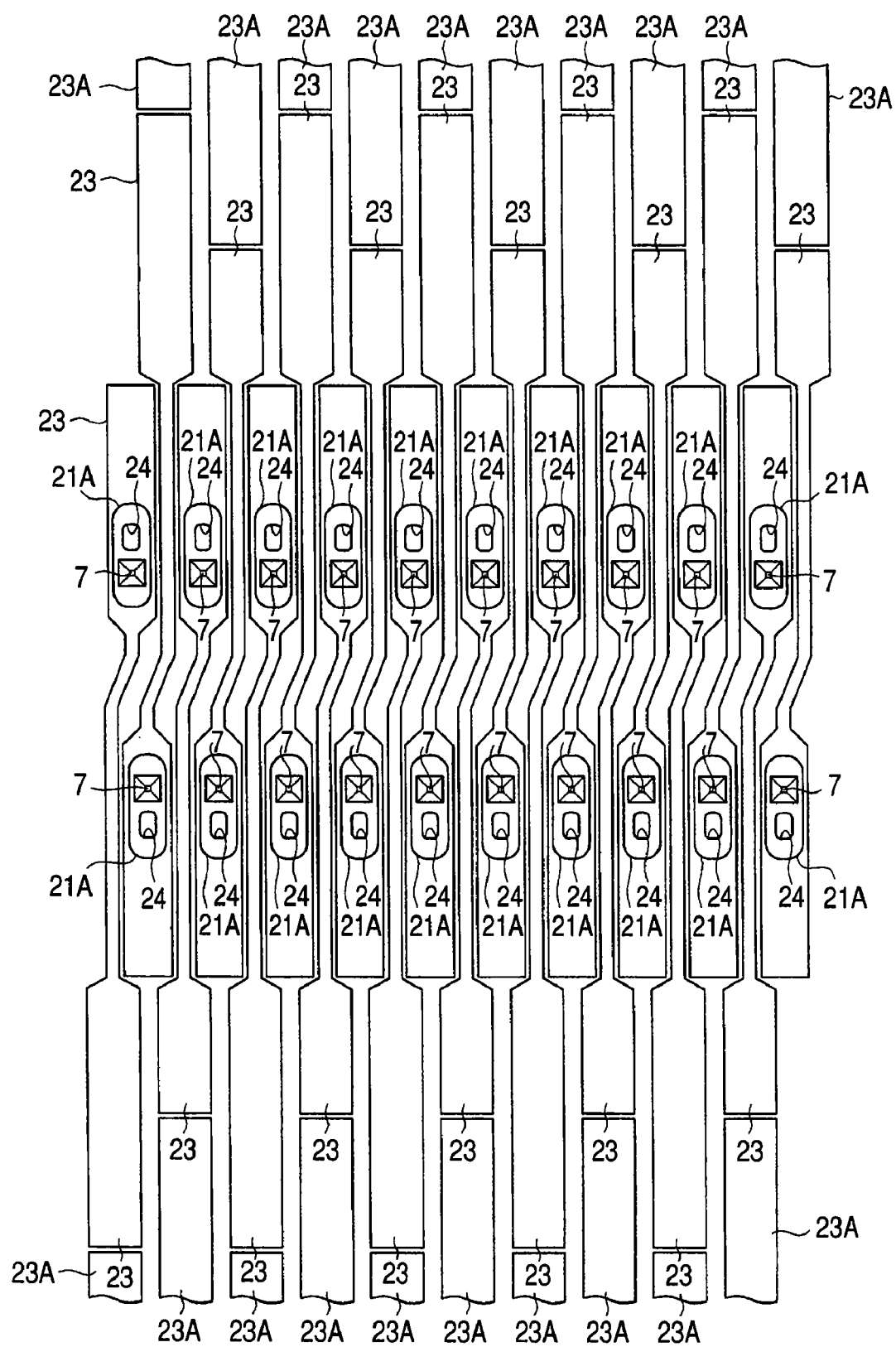
FIG. 20 is a fragmentary plan view illustrating the thin film sheet constituting the probe card according to Embodiment 1 of the present invention during the fabrication process thereof.
Figure 21:
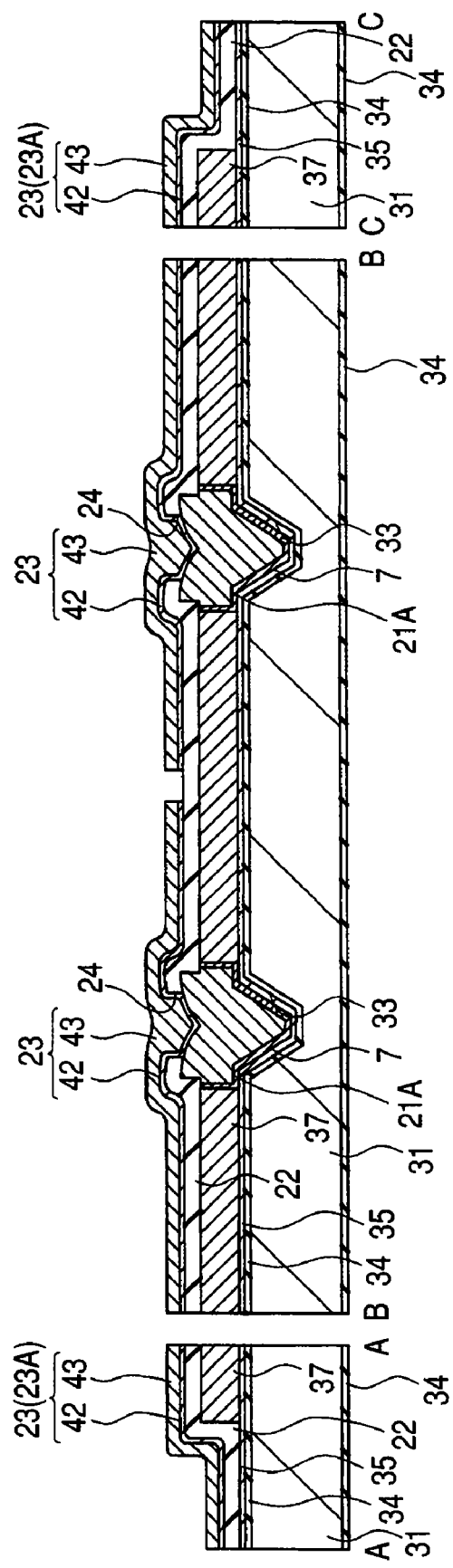
FIG. 21 is a fragmentary cross-sectional view of the thin film sheet during a fabrication step following that of FIG. 18.

As illustrated in FIGS. 20 and 21, the through-hole 24 reaching the metal film 21A is formed in the polyimide film 22. This through-hole 24 can be formed by dry etching with a photoresist film as a mask, dry etching with an aluminum film as a mask or punching with laser.

A conductive film 42 is then formed on the polyimide film 22 including the inside of the through-hole 24. This conductive film 42 can be formed, for example, by successively depositing a chromium film of about 0.1 µm thick and a copper film of about 1 µm thick by sputtering or vapor deposition. After formation of a photoresist film on the conductive film 42, the photoresist film is patterned by photolithography to form, in the photoresist film, an opening portion reaching the conductive film 42. A conductive film 43 is then formed on the conductive film 42 in the opening portion by plating. In Embodiment 1, a copper film or a film stack obtained by stacking a copper film and a nickel film one after another can be used as one example of the conductive film 43.

After removal of the photoresist film, interconnects 23 and 23A each made of the conductive films 42 and 43 are formed by etching the conductive film 42 with the conductive film 43 as a mask. The interconnect 23 can be electrically connected to the metal film 21A at the bottom of the through-hole 24. As described above using FIGS. 7 and 8, the interconnect 23A is an interconnect not electrically connected to the metal film 21A.

Figure 22:
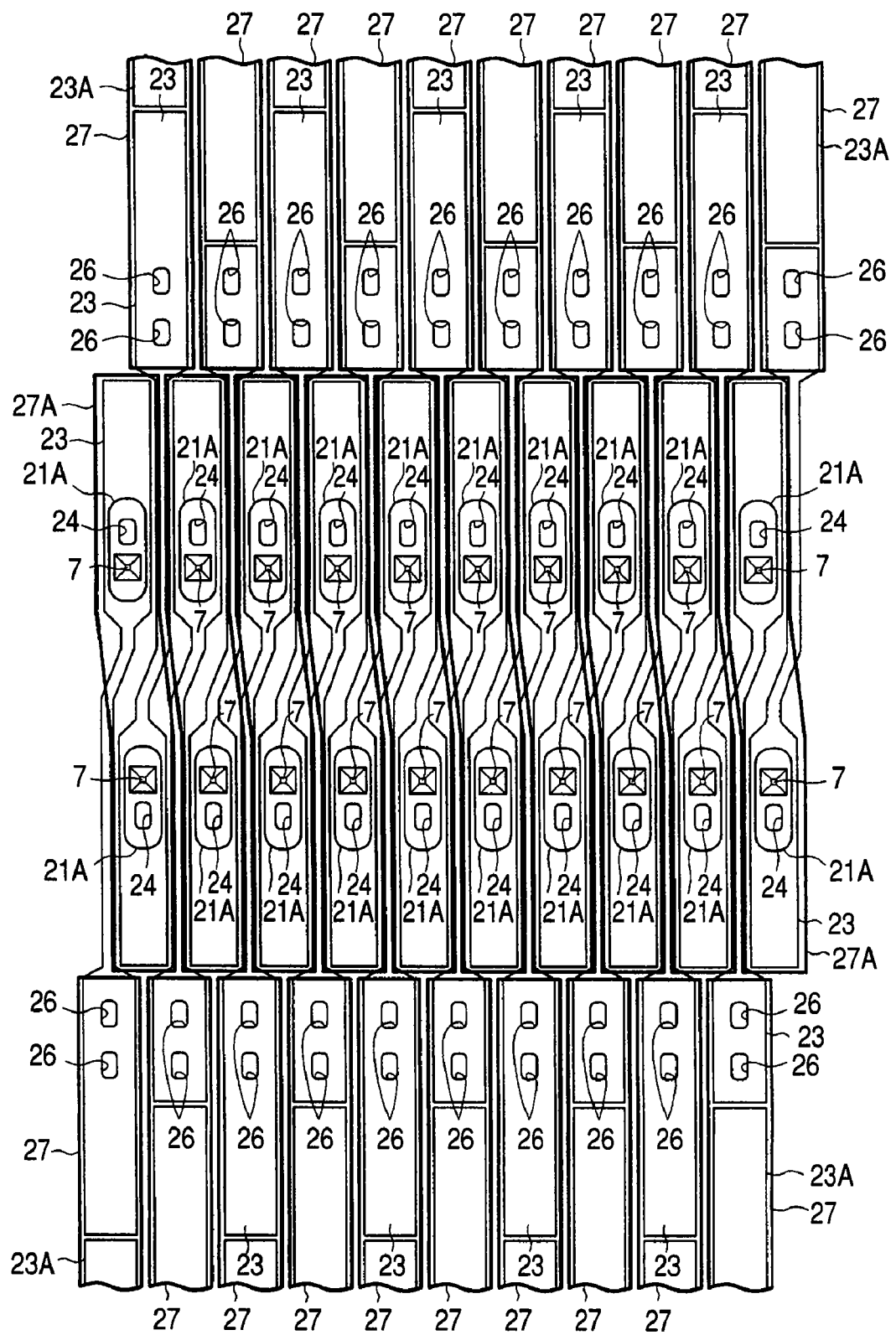
FIG. 22 is a fragmentary plan view of the thin film sheet during a fabrication step following that of FIG. 20.
Figure 23:
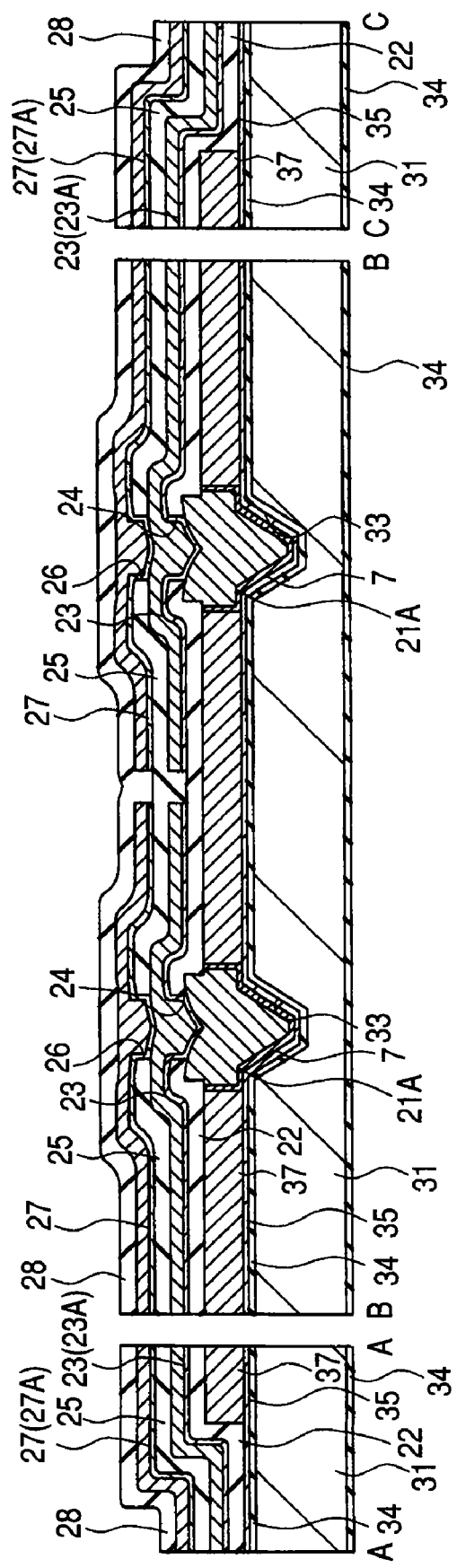
FIG. 23 is a fragmentary cross-sectional view of the thin film sheet during a fabrication step following that of FIG. 21.

As illustrated in FIGS. 22 and 23, the above-descried polyimide film 25 is formed over the main surface of the wafer 31. By similar steps to those employed for the formation of the through-hole 24, a through-hole 26 (also refer to FIGS. 7 and 8) reaching the interconnect 23 is formed.

Similar steps to those employed for the formation of the interconnects 23 and 23A, an interconnect 27 to be electrically connected to the interconnect 23 on the bottom portion of the through-hole 26 and an interconnect 27A not electrically connected to the interconnect 23 are formed. As illustrated in FIG. 21, similar steps to those employed for the formation of the polyimide film 25, a polyimide film 28 is then formed.

Figure 24:
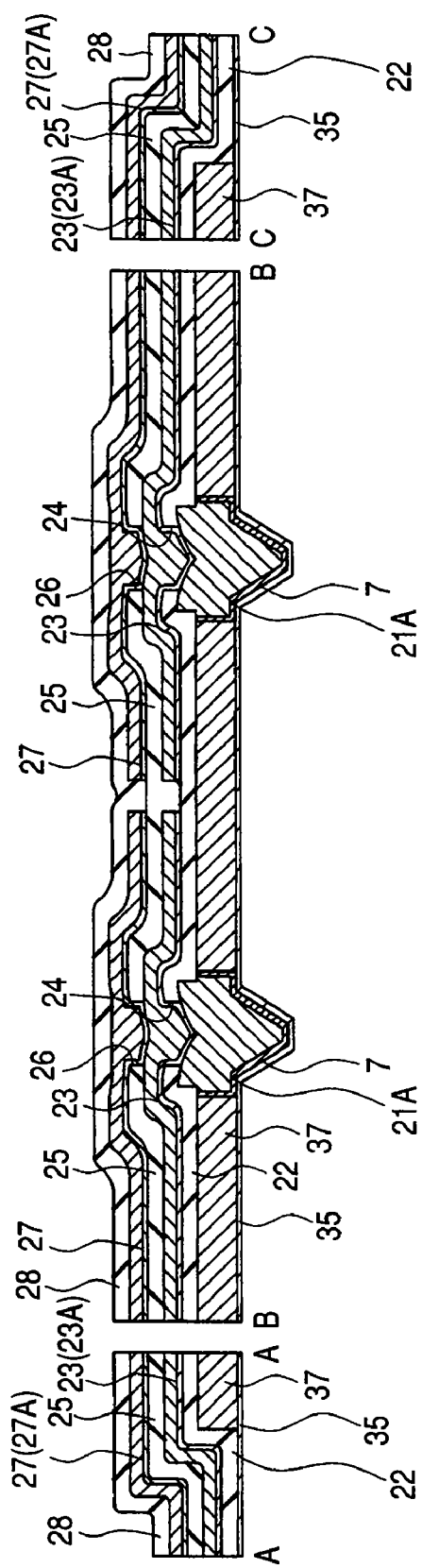
FIG. 24 is a fragmentary cross-sectional view of the thin film sheet during a fabrication step following that of FIG. 23.

As illustrated in FIG. 24, the silicon oxide film 34 is then removed from the back surface of the wafer 31 by etching, for example, with a mixture of hydrofluoric acid and ammonium fluoride. Then, by etching with an aqueous solution of a strong alkali (for example, an aqueous solution of potassium hydroxide), the wafer 31 serving as a frame material for forming the thin film sheet 2 is removed. The remaining silicon oxide film 34 is then removed by etching. This etching of the silicon oxide film 34 is conducted with a mixture of hydrofluoric acid and ammonium fluoride.

The conductive film 35 and copper film 37 are then etched successively to form the thin film sheet 2 of Embodiment 1 as illustrated in FIGS. 7 and 8. Described specifically, the chromium film included in the conductive film 35 is etched with an aqueous solution of potassium permanganate, while the copper film included in the conductive film 35 and the copper film 37 are etched with an alkaline copper etchant. By the steps so far described, the conductive film 39 (refer to FIG. 18) constituting the probe 7 appears from the surface of the probe 7. As descried above, the probe 7 having, on the surface thereof, the rhodium film has stable contact resistance because as described above, the material of the pad 11 of the chip 10 which will have contact with the probe 7 does not easily attach thereto, has higher hardness than Ni and at the same time is oxidation resistant. By the removal of the copper film 37, there appears a step difference at the position 6A (refer to region A-A and region C-C) which will lie below the adhesion ring 6 as illustrated in FIG. 8.

The number of interconnect layers may be increased further by repeating the formation steps of the through-hole 24, interconnect 23 and polyimide film 25 as needed.

Figure 25:
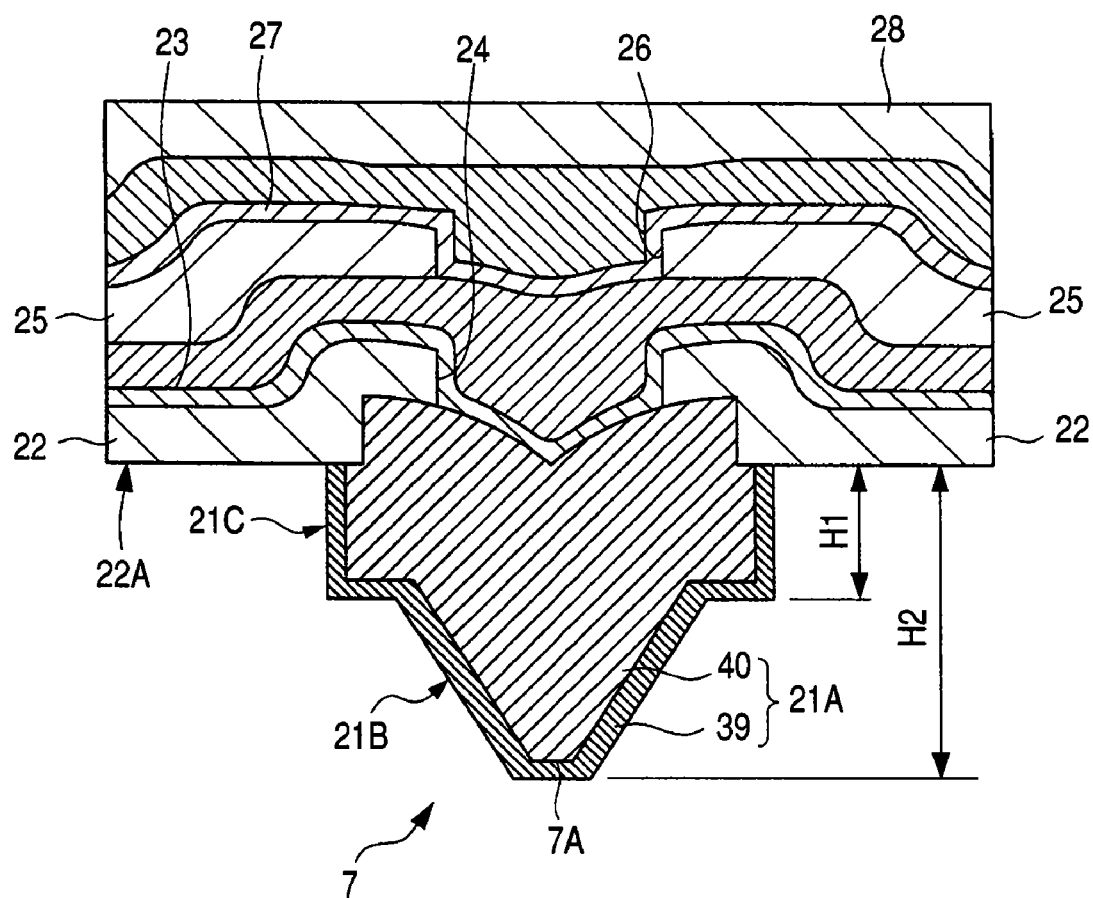
FIG. 25 is a fragmentary enlarged cross-sectional view of the thin film sheet constituting the probe card according to Embodiment 1 of the present invention.

FIG. 25 is a fragmentary cross-sectional view illustrating an enlarged portion of the thin film sheet 2 of Embodiment 1 in the vicinity of the probe 7.

As illustrated in FIG. 25, the probe 7 made of the metal film 21A which is a film stack has a tip 7A to be brought into contact with the pad of the chip 10 during probe testing. It also has an inclined surface portion 21B extending toward the tip 7A and a side surface portion 21C extending downwards from the back surface 22A of the polyimide film 22 (extending upwards from the inclined surface portion 21b). The metal film 21A has two portions, that is, a first portion encompassed with the inclined surface portion 21B and side surface portion 21C and a second portion protruding toward the upper portion of the back surface 22A of the polyimide film 22 from the upper end portion of the side surface portion 21C. The through-hole 24 formed in the polyimide film 22 is formed over the second portion. In short, the interconnect 23 connected to the metal film 21A via the through-hole 24 is connected to the second portion of the metal film 21A.

The height H1 of the side surface portion 21C of the metal film 21A is defined by the thickness (from about 10 μm to 20 μm in Embodiment 1) of the copper film 37 (for example, refer to FIG. 24) which has already been removed. A substantial height of the probe 7 is defined by the height H2 from the back surface 22A of the polyimide film 22 to the tip 7A of the probe 7.

When the thin film sheet 2 is formed without using the copper film 37, the metal film 21A does not have a portion corresponding to the side surface portion 21C so that the substantial height H2 of the probe 7 is inevitably defined by only the height of a portion encompassed by the inclined surface portion 21B. An increase in the substantial height H2 of the probe 7 only by this portion encompassed by the inclined surface portion 21C, if tried, leads to an increase in a plane size (region encompassed by the upper end portion of the inclined surface portion 21B) of a portion encompassed by the inclined surface portion 21B with an increase in the height H2, making it difficult to arrange two adjacent probes with a small pitch while isolating them electrically. It may therefore lead to an inconvenience.

In Embodiment 1, on the other hand, the substantial height H2 of the probe 7 is increased by forming, during the manufacturing steps of the thin film sheet 2, the copper film 37 having a plane size almost equal to that of the metal film 21A at a site which will be below the back surface 22A of the polyimide film 22 and finally removing the copper film 37. This makes it possible to increase the substantial height H2 of the probe 7 without enlarging the plane size of the portion encompassed by the inclined surface portion 21B of the metal film 21A. As a result, two adjacent probes can be arranged with a small pitch while electrically isolating them even if the substantial height H2 of the probe 7 increases. For example, supposing that the plane sizes of the portion encompassed by the inclined surface portion 21B of the metal film 21A in the above-described two cases are equal and the substantial height H2 of the probe 7 in the thin film sheet 2 manufactured without using the copper film 37 is about 15 μm, the substantial height H2 of the probe 7 in the thin film sheet 2 of Embodiment 1 manufactured using the copper film 37 can be made from about 25 to 35 μm, including the thickness of the copper film 37.

When probe testing is carried out using the probe card manufactured using the thin film sheet 2 of Embodiment 1 having a probe with an increased height H2, a possibility of contact of a foreign matter, even if it has attached to the surface of the wafer WH (chip 10) to be tested, with the thin film sheet 2 (back surface 22A of the polyimide film 22) can be reduced greatly. This means that breakage of the thin film sheet 2 due to contact thereof with the foreign matter can be prevented. In addition, since contact of the thin film sheet 2 with the foreign matter can be prevented, it is possible to avoid the damage of the chip 10 (wafer WH) to be tested due to the contact with the foreign matter, which has transferred from the chip 10 to the thin film sheet 2 and attached thereto, with the chip 10 again. Thus, the thin film sheet of this Embodiment can prevent such inconveniences.

When the thin film sheet 2 of Embodiment 1 whose probe 7 has an increased height H2 is used, cleaning treatment for removing the shavings of the pad 11 which have appeared as a result of the contact with the probe 7 can be performed easily, even if it is performed. This cleaning treatment is effected, for example, by rubbing the tip of the probe 7 against a polishing sheet. Since the probe has an increased height H2, contact of the foreign matter (such as shavings of the pad 11) on the polishing sheet with the thin film sheet 2 (back surface 22A of the polyimide film 22) and transfer and sticking of it to the thin film sheet 2 can be avoided. Thus, it is possible to prevent the breakage of the chip 10 (wafer WH) during the probe testing after the cleaning treatment. By such a cleaning treatment, the probe 7 and pad 11 can be brought into good contact with each other again, whereby the electric conduction between the probe 7 and pad 11 can be improved.

(Embodiment 2) Manufacturing steps of a thin film sheet 2 according to Embodiment 2 will next be described based on FIGS. 26 to 31. FIGS. 26 to 31 are fragmentary cross-sectional views illustrating a region corresponding to that of FIG. 8 of Embodiment 1 in individual steps.

Figure 26:
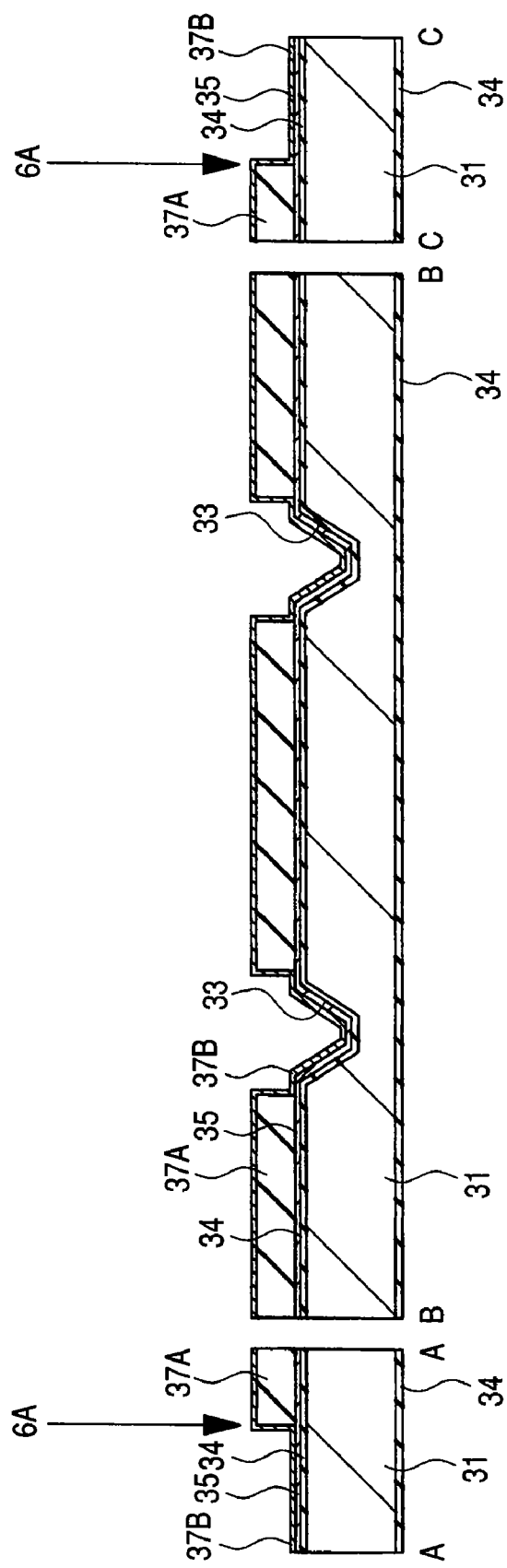
FIG. 26 is a fragmentary cross-sectional view explaining a fabrication process of a thin film sheet constituting a probe card of Embodiment 2 of the present invention.

Manufacturing steps of the thin film sheet 2 of Embodiment 2 are similar to those of Embodiment 1 until the steps explained based on FIGS. 13 to 15. After the step of FIG. 15, a polyimide film 37A having a thickness from about 10 to 20 μm is formed over the main surface of the wafer 31 as illustrated in FIG. 26. The resulting polyimide film 37A is removed selectively to leave the polyimide film 37A only in predetermined regions. Regions from which the polyimide film 37A has been removed are a region (refer to FIGS. 7 and 8) in which the metal film 21A described in Embodiment 1 is to be formed and a region (a region outside the position 6A (also refer to FIG. 8) which will lie below the adhesion ring 6) which will be outside the adhesion ring 6 (refer to FIG. 3) when the probe card is fabricated. A metal film (second thin film) 37B having a thickness of about 0.1 μm is then formed over the main surface of the wafer 31. This metal film 37 is made of a material having an etch selectivity relative to the surface metal of the probe 7 and polyimide film 22. In this Embodiment 2, a nickel film can be used as an example of it.

Figure 27:
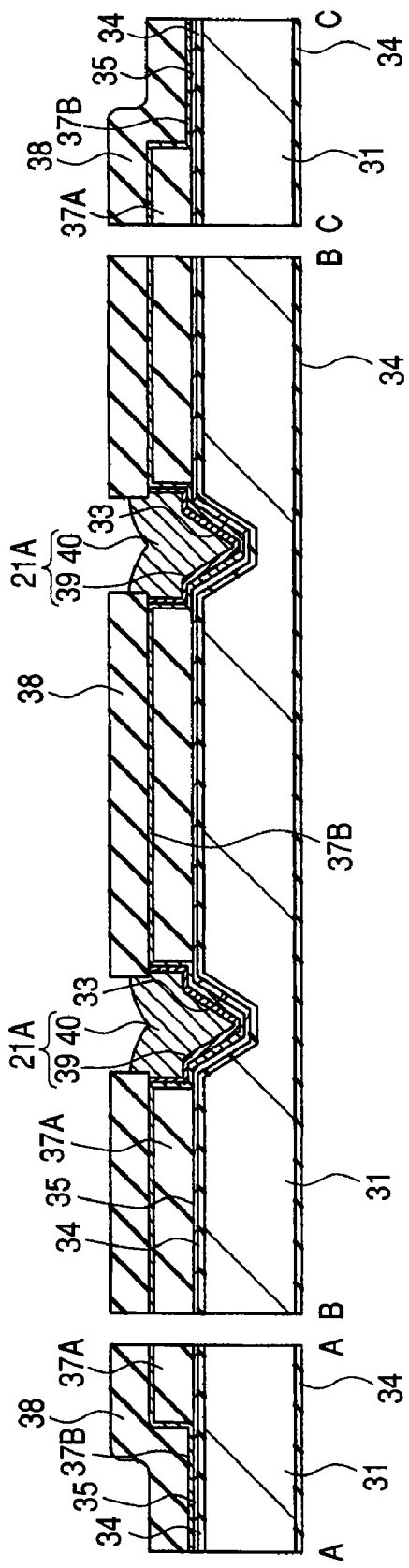
FIG. 27 is a fragmentary cross-sectional view of the thin film sheet during a fabrication step following that of FIG. 26.

As illustrated in FIG. 27, a photoresist film 38 is formed over the main surface of the wafer 31 in a similar step to that explained using FIG. 18 in Embodiment 1, followed by removal of the photoresist film 38 by photolithography from a region (also refer to FIGS. 7 and 8) in which the metal film 21A is to be formed in the later step, whereby an opening portion is formed.

A conductive film 39 and a conductive film 40 similar to those of Embodiment 1 are deposited successively on the conductive film 35, which has appeared from the bottom of the opening portion of the photoresist film 38, by electroplating with the conductive film 35 as an electrode. The metal film 21A is thus made of these conductive film 39 and conductive film 40.

Figure 28:
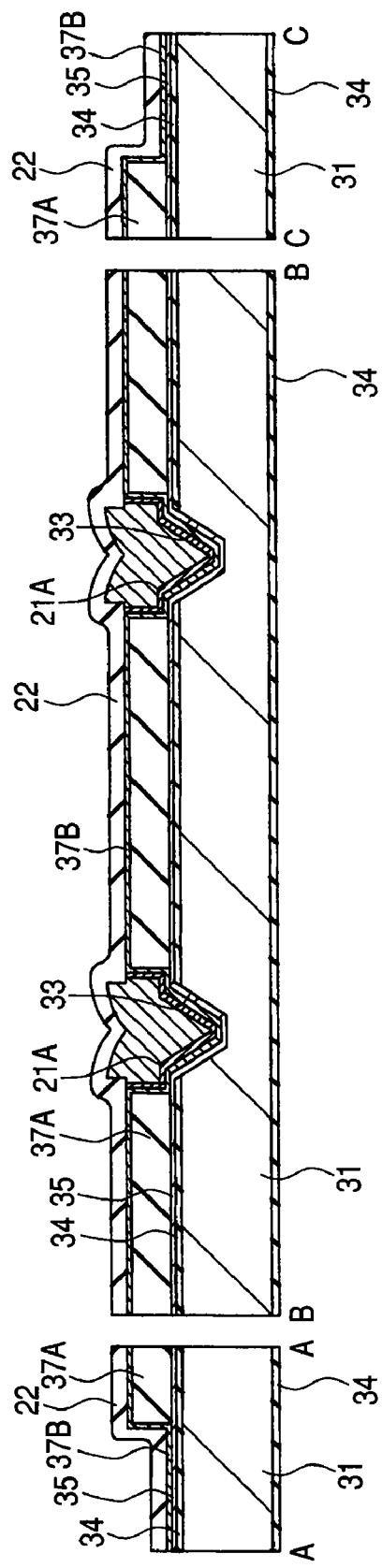
FIG. 28 is a fragmentary cross-sectional view of the thin film sheet during a fabrication step following that of FIG. 27.

After removal of the photoresist film 38 used for the formation of the metal film 21A (conductive films 39 and 40), a polyimide film 22 (refer to FIG. 8) is formed so as to cover therewith the metal film 21A, conductive film 35 and metal film 37B as illustrated in FIG. 28.

Figure 29:
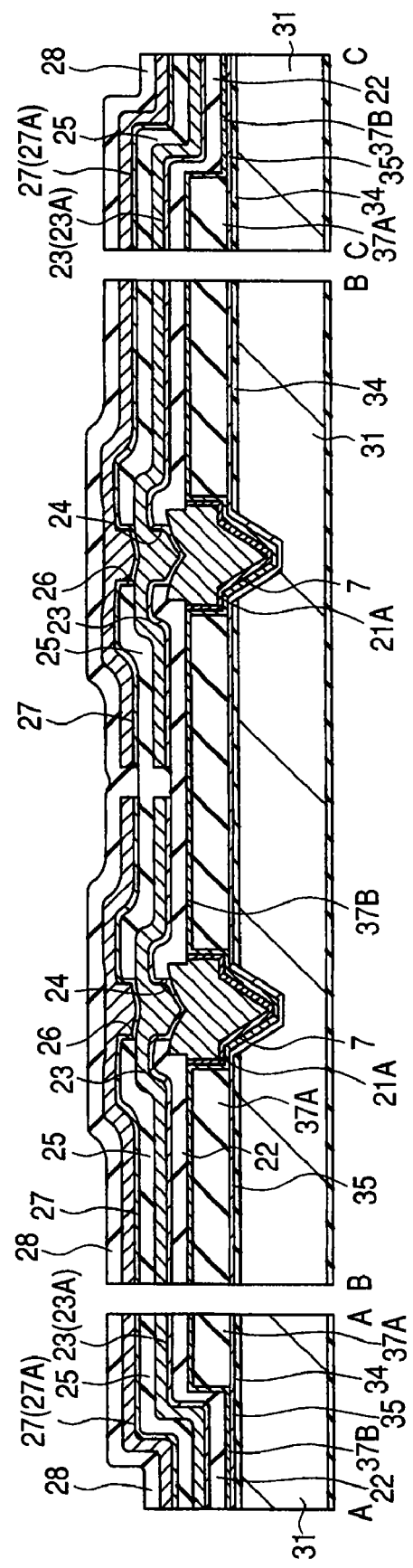
FIG. 29 is a fragmentary cross-sectional view of the thin film sheet during a fabrication step following that of FIG. 28.

As illustrated in FIG. 29, a through-hole 24, interconnects 23 and 23A, a polyimide film 25, a through-hole 26, interconnects 27 and 27A, and a polyimide film 28 are formed through similar steps to those described using FIGS. 20 to 23 in Embodiment 1.

Figure 30:
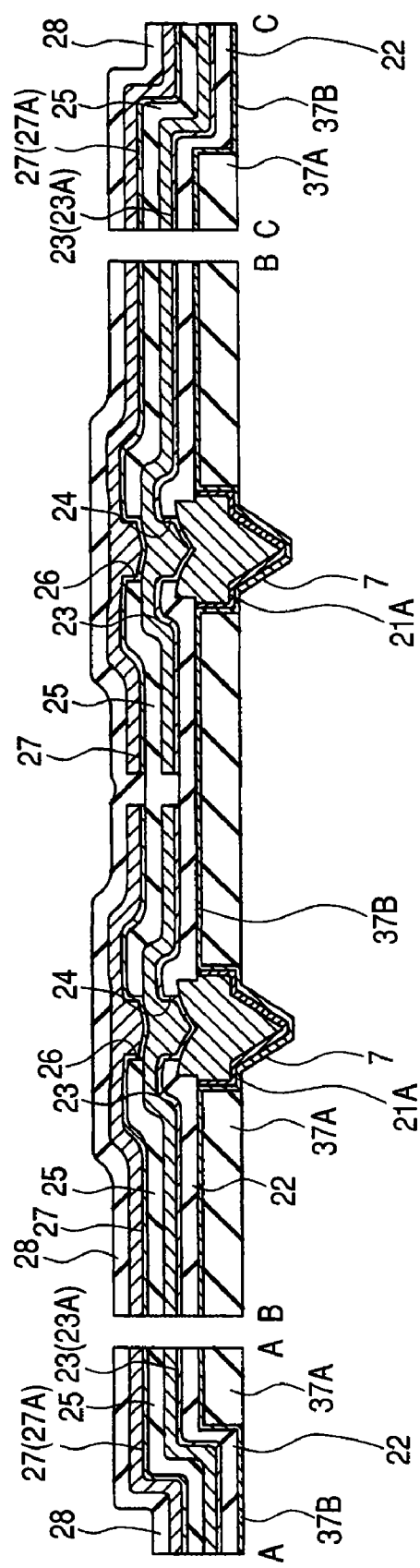
FIG. 30 is a fragmentary cross-sectional view of the thin film sheet during a fabrication step following that of FIG. 29.

As illustrated in FIG. 30, the silicon oxide film 34 is then removed from the back surface of the wafer 31 by etching with, for example, a mixture of hydrofluoric acid and ammonium fluoride. Etching with an aqueous solution of a strong alkali (for example, an aqueous solution of potassium hydroxide) is then performed to remove the wafer 31 serving as a frame material for forming the thin film sheet 2. The remaining silicon oxide film 34 is then removed by etching. Etching of this silicon oxide film 34 is performed with a mixture of hydrofluoric acid and ammonium fluoride.

Figure 31:
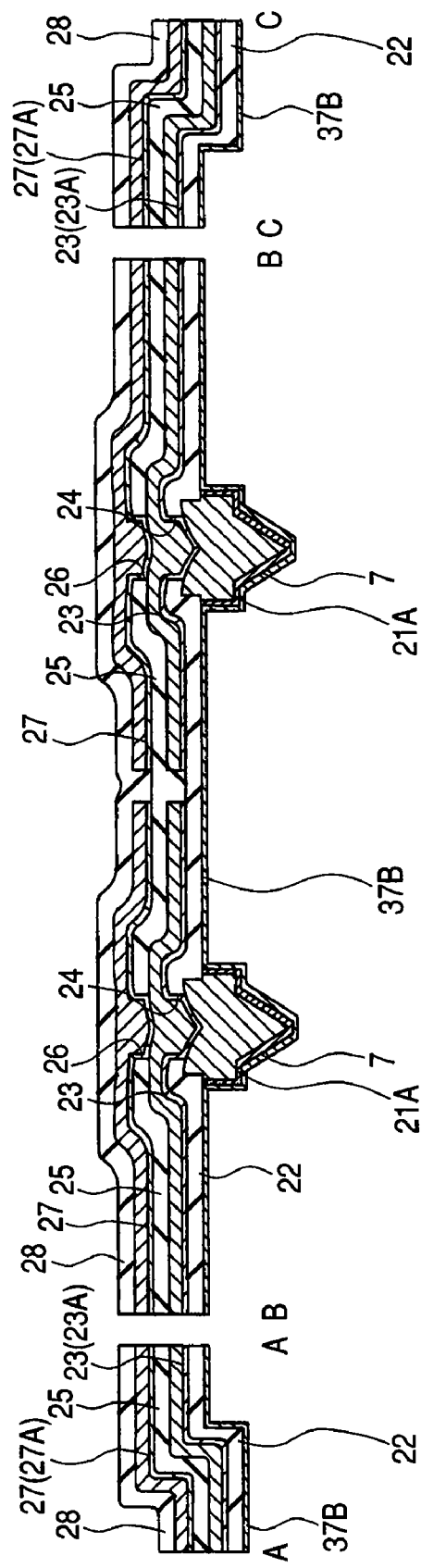
FIG. 31 is a fragmentary cross-sectional view of the thin film sheet during a fabrication step following that of FIG. 30.

As illustrated in FIG. 31, the polyimide film 37A is then removed. The removal of this polyimide film 37A can be carried out by wet etching or dry etching with the metal film 37B as an etching stopper or processing using a laser. The metal film 37B is then etched off, whereby the thin film sheet 2 of Embodiment 2 similar to the thin film sheet 2 of Embodiment 1 is manufactured (refer to FIGS. 7 and 8).

Embodiment 2 as described above can also bring about similar effects to those obtained in Embodiment 1.

The present invention made by the present inventors was described specifically based on some embodiments. It should however be borne in mind that the present invention is not limited to or by these embodiments but can be modified or changed without departing from the scope of the invention.

For example, in the above-described embodiments, an example of increasing the height of the probe formed on the thin film sheet by using a copper film during the manufacturing step of the thin film sheet was explained. Alternatively, the thin film may be made of a material other than copper. The material of the thin film is required to be capable of forming a film with uniform thickness and have an etch selectivity relative to the rhodium film to be a surface film of the probe and the polyimide film.

The manufacturing method of the semiconductor integrated circuit device and the probe card according to the present invention can be applied widely to a probe testing step in the manufacturing step of the semiconductor integrated circuit device.

What is claimed is:

1. A method of manufacturing a semiconductor integrated circuit device, comprising the steps of:
   (a) supplying a semiconductor wafer having a plurality of chip formation regions each having a semiconductor integrated circuit and a plurality of electrodes electrically coupled to the corresponding semiconductor integrated circuit;
   (b) supplying a wiring substrate, a thin film probe sheet connected to the wiring substrate and having a plurality of contact terminals which can be brought into contact with the plurality of electrodes of the semiconductor wafer, and a pressing mechanism constructed to bring the contact terminals of the thin film probe sheet into contact with the electrodes of the semiconductor wafer; and
   (c) carrying out, by the aid of the pressing mechanism, electrical testing of the semiconductor integrated circuit by bringing tips of the contact terminals of the thin film probe sheet into contact with the electrodes of the semiconductor wafer,
   wherein the thin film probe sheet has a plurality of first interconnects and an insulating film, which is formed over the contact terminals and has a plurality of through-holes therein, the plurality of first interconnects being formed over the insulating film and being electrically connected to the corresponding contact terminals via the through-holes,
   wherein each contact terminal includes a first metal film and a second metal film stacked over the first metal film, the first metal film having an inclined surface portion extending toward the contact terminal tip and a side surface portion extending from the inclined surface portion to a back surface portion of the insulating film, and the second metal film having a first portion surrounded by the inclined surface portion and the side surface portion of the first metal film and a second portion protruding into the insulating film such that an upper surface and a side surface of the second portion contact the insulating film, each through-hole in the insulating film being arranged over the corresponding second portion of the second metal film such that the corresponding first interconnect is directly contacted with said second portion via the respective through-hole,
   wherein the side surface portion of the first metal film has an upper surface in contact with the back surface portion of the insulating film,
   wherein the first portion of the second metal film has peripheral portions of an upper surface thereof in contact with the back surface portion of the insulating film, and
   wherein the electrical testing is carried out while maintaining a height between the semiconductor wafer and the back surface portion of the insulating film.

2. A method of manufacturing a semiconductor integrated circuit device according to claim 1,
   wherein the first metal film includes a metal material having higher hardness than that of the second metal film, and wherein in the step (c), the first metal film of the contact terminals has contact with the electrodes of the semiconductor wafer.

3. A method of manufacturing a semiconductor integrated circuit device according to claim 2,
wherein the first metal film has rhodium as a principal component thereof and the second metal film is a plating having nickel as a principal component thereof.

4. A method of manufacturing a semiconductor integrated circuit device according to claim 1, further comprising the step of, after the step of (c), dividing the semiconductor wafer along the chip formation regions into a plurality of semiconductor chips.

5. A method of manufacturing a semiconductor integrated circuit device sheet according to claim 1,
wherein the height defined by the semiconductor wafer and the back surface portion of the insulating film is 10 µm or greater.

6. A method of manufacturing a semiconductor integrated circuit device according to claim 1,
wherein the insulating film is comprised of a polyimide film.

7. A method of manufacturing a semiconductor integrated circuit device according to claim 1,
wherein the thin film probe sheet has a plurality of second interconnects and a second insulating film, which is formed over the first insulating film and has a plurality of second through-holes therein, the plurality of second interconnects being electrically connected to corresponding ones of the first interconnects via the second through-holes.

8. A method of manufacturing a semiconductor integrated circuit device according to claim 7, wherein each second through-hole overlaps with a corresponding one of the first through-holes in plan view.

9. A method of manufacturing a semiconductor integrated circuit device according to claim 1, wherein the second portion of the second metal film is substantially centered over the first portion of the second metal film.

\* \* \* \* \*